(12) United States Patent
Lovell et al.

(10) Patent No.: US 12,072,307 B2
(45) Date of Patent: *Aug. 27, 2024

(54) METHOD FOR DETERMINING PHYSICAL REPRESENTATION OF SPECIES IN FLUID FLOWING THROUGH SYSTEM

(71) Applicant: MICROSILICON, INC., Katy, TX (US)

(72) Inventors: John Lovell, Houston, TX (US); Omar Kulbrandstad, Katy, TX (US)

(73) Assignee: MICROSILICON, INC., Katy, TX (US)

( * ) Notice: Subject to any disclaimer, the term of this patent is extended or adjusted under 35 U.S.C. 154(b) by 117 days.

This patent is subject to a terminal disclaimer.

(21) Appl. No.: 17/932,589

(22) Filed: Sep. 15, 2022

(65) Prior Publication Data
US 2023/0097890 A1 Mar. 30, 2023

Related U.S. Application Data

(63) Continuation of application No. 16/703,163, filed on Dec. 4, 2019, now Pat. No. 11,448,608.
(Continued)

(51) Int. Cl.
*G01N 24/10* (2006.01)
(52) U.S. Cl.
CPC .................... *G01N 24/10* (2013.01)
(58) Field of Classification Search
CPC ..... G01N 24/10; G01N 24/081; G01R 33/307
See application file for complete search history.

(56) References Cited

U.S. PATENT DOCUMENTS

| 3,993,131 A | 11/1976 | Riedel |
| 4,661,700 A | 4/1987 | Holenka |
(Continued)

FOREIGN PATENT DOCUMENTS

| WO | WO-2018/148280 A1 | 8/2016 |
| WO | 2016/187300 A1 | 11/2016 |
(Continued)

OTHER PUBLICATIONS

D. Abdallah, et al., "Asphaltene Studies in On-shore Abu Dhabi Fields, Part IV: Development of a Surface Sensor," SPE-191676 presented at SPE ATCE Dallas, 2018, pp. 1-17.
(Continued)

*Primary Examiner* — Jay Patidar
(74) *Attorney, Agent, or Firm* — Patterson + Sheridan, LLP

(57) ABSTRACT

Embodiments described herein generally relate to systems, tools, and methods for flow assurance monitoring within pipe structures. In an embodiment is provided a method of determining at least one property of a mixture flowing through a system that includes introducing an inhibitor to a fluid flowing through the system to form the mixture; exposing the mixture to electromagnetic energy to induce at least one paramagnetic response from at least one diamagnetic species present in the mixture flowing through the system; performing electron paramagnetic resonance (EPR) spectroscopy on the at least one paramagnetic response to generate an EPR spectrum; and determining the at least one property of the mixture based on the EPR spectrum. Apparatus for determining fluid properties and systems for extracting hydrocarbons from a subterranean reservoir are also provided.

20 Claims, 10 Drawing Sheets

Related U.S. Application Data

(60) Provisional application No. 62/872,013, filed on Jul. 9, 2019, provisional application No. 62/797,649, filed on Jan. 28, 2019, provisional application No. 62/775,172, filed on Dec. 4, 2018.

(56) References Cited

U.S. PATENT DOCUMENTS

| | | | |
|---|---|---|---|
| 5,173,612 | A | 12/1992 | Imai et al. |
| 5,804,820 | A | 9/1998 | Evans et al. |
| 6,346,813 | B1 | 2/2002 | Kleinberg |
| 6,573,715 | B2 | 6/2003 | King |
| 8,212,563 | B2 * | 7/2012 | White ............... G01R 33/60 324/318 |
| 9,341,571 | B2 | 5/2016 | Mackay et al. |
| 9,359,677 | B2 | 6/2016 | Mackenzie et al. |
| 9,689,954 | B2 | 6/2017 | Yang et al. |
| 9,926,485 | B2 | 3/2018 | Yan et al. |
| 10,564,308 | B1 | 2/2020 | Godoy et al. |
| 2001/0028247 | A1 * | 10/2001 | King ............... G01R 33/60 324/312 |
| 2013/0236983 | A1 | 9/2013 | Lehmann et al. |
| 2016/0223478 | A1 | 8/2016 | Babakhani et al. |
| 2016/0238531 | A1 | 8/2016 | Mackay et al. |
| 2018/0120390 | A1 | 5/2018 | Babakhani et al. |
| 2018/0224414 | A1 | 8/2018 | Kulbrandstad et al. |
| 2019/0277729 | A1 | 9/2019 | Yan et al. |
| 2019/0302306 | A1 | 10/2019 | Kulbrandstad et al. |

FOREIGN PATENT DOCUMENTS

| | | |
|---|---|---|
| WO | WO-2016/187300 A1 | 11/2016 |
| WO | 2018/148280 A1 | 8/2018 |

OTHER PUBLICATIONS

Abdallah et al., "From Ideation to Commercialization—Development of the First Real-Time Monitoring Device for Asphaltene Deposition," Society of Petroleum Engineers, SPE-198615-MS, 2019, pp. 1-12.

I. Aiad, et al., "Some Corrosion Inhibitors Based on Schiff Base Surfactants for Mild Steel Equipments," Journal of Dispersion Science and Technology, vol. 30, 2009, issue 8, pp. 1142-1147, <https://doi.org/10.1080/01932690802701598>.

T. Andersen, et al., "Pipeline Reliability: An Investigation of Pipeline Failure Characteristics and Analysis of Pipeline Failure Rates for Submarine and Cross-Country Pipelines," Journal of Petroleum Technology, Apr. 1983, pp. 709-717.

Atta et al., "Novel dispersed magnetite core-shell nanogel polymers as corrosion inhibitors for carbon steel in acidic medium," Corrosion Science, vol. 53, Issue 5, May 2011, pp. 1680-1689; <https://doi.org/10.1016/j.corsci.2011.01.019>.

F. Bentiss et al., "Influence of 2,5-bis(4-dimethylaminophenyl)-1,3,4-thiadiazole on corrosion inhibition of mild steel in acidic media," Journal of Appl Electrochemistry, 31 (2001), pp. 41-48.

E. Bordignon, EPR Spectroscopy of Nitroxide Spin Probes, eMagRes, vol. 6, 2017, pp. 235-253.

D. Brondel, et al., "Corrosion in the Oil Industry," SLB Oilfield Review, Apr. 1994, pp. 4-18.

V. Cicek, "Novel Metallo-Organic Corrosion Inhibitors for Mild Steel and Aluminium Alloys in Aqueous Solutions and Sol-Gel Coatings," Dissertation, Oklahoma State University, Jul. 2008, 350 Pgs. <https://www.corrosionpedia.com/dictionary/tags/type-of-corrosion>.

De Hosson and Kooi, pp. 76.

G. H. Dodd, et al., "Spinn Probes for Binding Site Polarity," Febs Letters, vol. 8, No. 5, Jun. 1970, pp. 286-288.

R. Driver, et al., "Contrasting Behaviour of Mild Steel and Pure Iron toward Picking Inhibitors," Nov. 20, 2013, 1 Pg . . . .

Eaton et al., "Quantitative EPR," SpringerWienNetYork, 2010, 192 Pgs.

K. Y. El-Baradie, et al., "Synthesis, characterization and corrosion inhibition in acid medium of I-histidine Schiff base complexes," Applied OrganoMetallic Chemistry, vol. 29, Issue 3, Mar. 2015, pp. 117-125, <https://doi.org/10.1002/aoc.3255>.

G. El Mahdy et al., "Protection of Petroleum Pipeline Carbon Steel Alloys with New Modified Core-Shell Magnetite Nanogel against Corrosion in Acidic Medium," Journal of Chemistry, vol. 2013; pp. 1-10.

M. Elachouri, et al., "Some Nonionic Surfactants as Inhibitors of the Corrosion of Iron in Acid Chloride Solutions," Corrosion, 52 (1996), pp. 103-108, <https://doi.org/10.5006/1.3292100>.

O. E. Eltaib et al., "Crude Oil Pipeline Scale Desposition: Causes and Removal Methods," Department of Chemical Engineering, Faculty of Engineering University Khartoum, Annual Conference of Postgraduate Studies and Scientific Research, Feb. 2012, 6 Pgs.

R. R. Fessler, "Pipeline Corrosion," Final Report, Nov. 2008, pp. 1-78.

F. M. Gelardi, "Gamma rays Induced Conversion of Native Defects in Natural Silica," Defects in SiO2 and Related Dielectrics: Science and Technology. NATO Science Series (Series II: Mathematical and Physical Chemistry), vol. 2. Springer, Dordrecht, 2000, 1 Pg. <https://doi.org/10.1007/978-94-010-0944-7_9>.

O.H. Griffith, et al., "Nitroxide Free Radicals: Spin Labels for Probing Biomolecular Structure," Spin Labels for Probing Biomolecular Structure, Acc. Chem. Res., 1969, vol. 2, pp. 17-24.

N. Hajjaji, et al., "Effect of N-Alkylbetaines on the Corrosion of Iron in 1 M HCI Solution," Corrosion Science Section, vol. 49, No. 4, (1993), pp. 327-333. <https://doi.org/10.5006/1.3316057>.

Hosseini et al., "Synergism and antagonism in mild steel corrosion inhibition by sodium dodecylbenzenesulphonate and hexamethylenetetramine," Corros. Sci., 45 (2003) 1473<https://doi.org/10.1016/S0010-938X(02)00246-9>.

D. Howard et al., "Investigation of the Exxon Company U.S.A. Pipline Leak Eugene Island Block 314, May 6, 1990," U.S. Department of Interior, Minerals Managment Service, Gulf of Mexico OCS Regional Office, New Orleans, Nov. 1991, pp. 1-20.

D.M. Jamil et al., "Experimental and theoretical studies of Schiff bases as corrosion inhibitors," Chemistry Central Journal, Dec. 2018, 12:7, 10 Pgs.

C. Jolicoeur, "ESR Lineshapes and Kinetic Behavior of Nitroxide Spin Probes in Micellar Solutions," Journal of Solution Chemistry, vol. 7, No. 11, 1978, pp. 813-835.

V. Jovancicevic, et al., "Inhibition of Carbon Dioxide Corrosion of Mild Steel by Imidazolines and Their Precursors," Corrosion, 1999, vol. 55 No. 5, pp. 449-455, <https://doi.org/10.5006/1.3284006>.

K. A. Kachariasse, "Investigation of Micelles, Microemulsions, and Phospholipid Bilayers with the N-Phenolbetaine ET (30), a Polarity Probe for Aqueous Interfaces," J. Phys. Chem. 1981, 85, pp. 2676-2683.

E. A. Khamis, "Magnetite nanoparticles/polyvinyl pyrrolidone stabilized system for corrosion inhibition of carbon steel," Egyptian Journal of Petroleum, 2018, pp. 919-926.

O. Kulbrandstad, "Real-time Asphaltene Measurements Improve Flow Assurance Workflows and Reduce Costs," Tekna Norway, Feb. 25, 2018, pp. 1-15.

F. R. Longo, "Porphyrins as Corrosion Inhibitors," US Navy Report No. NADC-84167-60, 1984, 55 Pgs.

J. Lovell, et al., "12 Months of Real-Time Digital Chemistry in 3-Phase Flow = Lessons Learned and Plans Forward," Society of Petroleum Engineers, 2019, SPE-196062-MS, pp. 1-15.

J. Lovell, et al., "An induction gradiometer for conductivity contrast detection: Theoretical considerations," Radio Science, vol. 28, No. 4, pp. 357-371, Jul.-Aug. 1990.

J. Lovell, "Digitizing Chemical Data for Real Time Flow Assurance," IPTC-19606-MS, International Petroleum Technology Conference, 2020, pp. 1-11.

J. R. Lovell, et al., "Effect of tool eccentricity on some electrical well-logging tools," IEEE Transactions on Geoscience and Remote Sensing, 1990, pp. 127-136.

(56) References Cited

OTHER PUBLICATIONS

Bales, B.L. "A Definition of the Degree of Ionization of a Micelle Based on Its Aggregation Number," J. Phys. Chem. B 2001, 105, pp. 6798-6804.
Mackenzie, et al., "Micelle Detection for Optimizing Corrosion Inhibitor Dose on an Offshore Platform," SPE 155107, SPE International Conference & Workshop on Oilfield Corrosion, Aberdeen, 2012, pp. 1-7.
Mackenzie, et al, "Potential for Measurement of Corrosion-Inhibitor-Micelle Presence as an Indicator of Optimum Dose," Jun. 2012, SPE Journal, pp. 393-401.
M. A. Malik, et al., "Anti-corrosion Ability of Surfactants: A Review," Int J. Electrochem. Sci, 6, 2011, pp. 1927-1948.
D. Marsh, "Spin-Label EPR for Determining Polarity and Proticity in Biomolecular Assemblies: Transmembrane Profiles," Applied Magnestic Resonance, Appl Mag Reson (2010) 37; pp. 435-454.
P. McCarty, et al., "Chemical Indicators and Surrogate Parameters in Water Treatment," Journal American Water Works Association, vol. 76, No. 10, Oct. 1984, 10 Pgs.
Nassar et al., "Synthesis, Characterization and Anticorrosion Studies of New Homobimetallic Co(II), Ni(II), Cu(II), and Zn(II) Schiff Base Complexes," J Bio Tribo Corros, 2015, 1:19, pp. 1-16.
National Academies of Sciences, "Improving the Safety of Marine Pipelines," The National Academies of Sciences Engineering Medicine, The National Academies Press, http://nap.edu/2347, 156 Pgs.
G. N. Mu, et al., "Effect of Metallic Cations on Corrosion Inhibition of an Anionic Surfactant for Mild Steel," Corrosion, 52 (1996), pp. 853-853, <https://doi.org/10.5006/1.3292077>.
O. Olabisi,, PhD., "Identifying Key Performance Indicators for Corrosion in Oilfield Water Handling Systems," paper #4348, Corrosion 2014 Conference, San Antonio, TX, pp. 1-14.
Osman et al,, "The inhibition properties of some non-iconic surfactants on steel chloride acid solution," Contributed papers, Anti-Corrosion Methods and Materals, vol. 44, No. 5, 1997, pp. 318-322.
J. Palmer, et al, "Optimization of Magnetic Field Sweep and Field Modulation Amplitude for Continuous-Wave EPR Oximetry," Journal of Magnetic Resonance. Apr. 2011; 209(2), pp. 337-340.
"Pipeline Leaks and Breaks," Minerals Management Service, U.S. Department of Interior, Metairie, La, 1990.
Popoola et al., "Corrosion Problems during Oil and Gas Production and its Mitigation," International Journal of Industrial Chemistry, 2013, 4:35, pp. 1-15.
A. Popova, "Inhibitive Properties of Quaternary Ammonium Bromides of N-Containing Heterocycles on Acid Mild Steel Corrosion," Journal of the University of Chemical Technology and Metallurgy, 43, 1, 2008, pp. 37-47.
L-G. Qiu et al., "Understanding the effect of the spacer length on adsorption of gemini surfactants onto steel surface in acid medium," Applied Surface Science, School of Chemistry and Chemical Engineering, Anhui University, China, 246 (2005), pp. 1-5.
S. Rankin et al "Technology Update: Improving Corrosion Management by Using a Micelle Detection Technology," SPE-0318-0020, Journal Petroleum Technology, Mar. 2018, pp. 20-22.
P. Rostron, "Critical Review of Pipeline Scale Measurement Technologies," Indian Journal of Science and Technology, 2018, vol. 11(17), pp. 1-18.
M.A.H. Rushdi, et al., "Physico-chemical studies for strontium sulfate radiation dosimeter," Journal of Radiation Research and Applied Sciences, vol. 8, Issue 2, Apr. 2015, pp. 221-225, <https://doi.org/10.1016/j.irras.2015.01.006>.
J. L. Salager, "Surfactants Types and Uses," FIRP Booklet # E300-A, 2002.
P. Singh et al., "Synthesis, structural and corrosion inhibition properties of some transition metal(II) complexes with o-hydroxyacetophenone-2-thiophenoyl hydrazine," Polyhedron 65:73-81 Nov. 2013; <https://doi.org/10.1016/j.poly.2013.08.008>, pp. 73-81.
K.M. Smith, "Porphyrins and Metalloporphyrins," Scientific Publishing Company, 1975, pp. 460-473.
Swidzinski et al., "Corrosion Inhibition of Wet Gas Pipelines Under High Gas and Liquid Velocities," Corrosion 2000, Paper No. 00070, pp. 1-17.
J. Starting, "A Survey of Pipelines in the North Sea: Incidents During Installation, Testing and Operation," OTC-4069-MS, Offshore Technology Conference, Paper No. 4069, 1981, pp. 25-32.
R. H. Tammam, "Understanding Different Inhibition Actions of Surfactants for Mild Steel Corrosion in Acid Solution," Int. J. Electrochem. Sci. 11 (2016), pp. 1310-1326.
R.N. Tuttle, "Corrosion in Oil and Gas Production," Journal of Petroleum Technology 39, 1987, SPE-17004-PA, pp. 756-762.
D. N. Veritas, "A Guideline Framework for the Integrity Assessment of Offshore Pipelines," Technicol Report No. 44811520, Revision No. 2, 104 Pgs.
C.Wang et al., "Synthesis of Schiff Base Surfactants and Their Corrosion Inhibition Effect on Tubing Steel in Deep Oil Wells," Int. J. Electrochem. Sci., 11 (2016), pp. 4399-4409.
Windle, J.J., "Hyperfine coupling constants for nitroxide spin probes in water and carbon tetracholoride," J. Magnetic Resonance, vol. 45, Issue 3, 1981, pp. 432-439.
X. Yang, et al., "Detecting Asphaltenes by a Miniaturized Electron Paramagnetic Resonance (EPR) Sensor," IPTC 17618, International Petroleum Conferences, 2014, pp. 1-5.
Non-Final Office Action dated Oct. 20, 2021, for corresponding U.S. Appl. No. 16/703,163.
N. Hajaji, et al., "Effect of N-Alkylbetaines on the Corrosion of Iron in 1 M HCI Solution," Corrosion Science Section, vol. 49, No. 4, (1993), pp. 327-333. <https://doi.org/10.5006/1.3316057>.
M.A.H. Rushdi, et al., "Physico-chemical studies for strontium sulfate radiation dosimeter," Journal of Radiation Research and Applied Sciences, vol. 8, Issue 2, Apr. 2015, pp. 221-225, <https://doi.org/10.1016/j. jrras.2015.01.006>.

* cited by examiner

METHOD FOR DETERMINING PHYSICAL REPRESENTATION OF SPECIES IN FLUID FLOWING THROUGH SYSTEM

CROSS-REFERENCE TO RELATED APPLICATIONS

This application is a continuation of U.S. Non-Provisional application Ser. No. 16/703,163, filed on Dec. 4, 2019, which claims benefit of U.S. Provisional Patent Application Ser. No. 62/775,172, filed Dec. 4, 2018, U.S. Provisional Patent Application Ser. No. 62/797,649 filed Jan. 28, 2019, and U.S. Provisional Patent Application Ser. No. 62/872,013 filed Jul. 9, 2019, all of which are herein incorporated by reference in their entireties.

FIELD

The present disclosure generally relates to systems, tools, and methods for flow assurance monitoring within pipe structures.

BACKGROUND

Corrosion and solid deposits in pipe structures affect a variety of industries such as the petroleum industry, the chemical and petrochemical industry, and water treatment. In the petroleum industry, ensuring successful and economical flows of hydrocarbons from reservoirs, i.e., flow assurance, is paramount. When flow assurance is not guaranteed, production from the reservoir can cease and the financial interruption and/or asset damage can be significant. Flow assurance challenges include effectively handling corrosion and the deposition of solids in pipe structures. Corrosion of pipe structures can cause breach and within chemical, petrochemical and treatment facilities can cause significant health, safety, and environmental damage. For example, a pipeline rupture that spilled an estimated 100,000 gallons of crude oil onto a beach near Santa Barbara occurred along a corroded section of pipe that had worn away to just a fraction of an inch in thickness.

While corrosion can lead to undesired fluid leakage from a pipe, other flow-assurance challenges can also impede the flow by build-up of solids inside the pipe. Scale is a common inorganic obstruction and, at least for the oil industry, paraffin wax and asphaltene depositions are common organic buildups. Bacteria can also cause both corrosion and solid accumulation.

Solid deposits such as hydrates, asphaltenes, wax, and scale can build up within pipe structures and choke off production or otherwise impede the use of the pipeline or tubular. The effects of such impedance can be quite expensive and rapid. In one North Sea well (Miller field), production fell from 30,000 barrels per day to zero barrels per day in just 24 hours because of scaling. The cost for cleaning out that single well and putting it back on production was approximately the same as the chemical costs to treat the entire field.

Conventional approaches to mitigate scale, asphaltenes, corrosion, and other deleterious effects include injection of chemicals, such as surfactants and/or other chemicals that have both hydrophobic and hydrophilic moieties. At sufficient concentrations, such chemicals form micelles that aid in inhibiting corrosion and solid deposition. As used herein, a micelle generally refers to an aggregation of molecules in a colloidal suspension and a surfactant is a chemical species that has a preference to form micelles once it is at a sufficiently high concentration, known as the CMC (critical micelle concentration). Staying at concentrations of, or slightly above, the CMC has been shown as an optimum for most inhibitor chemicals. Consequently, derivation of the CMC is a key parameter for flow assurance problems that are being addressed with surfactants.

Traditional techniques to derive the CMC for oilfield applications relied on indirect inferences such as measuring surface tension or fluid conductivity, but more recently optical techniques have been introduced that combine reagents with fluorescence detection, e.g., by using polarity-sensitive hydrophobic probes like pyrene or 1-anilinonaphthalene-8-sulfonic acid. When micelles are formed, the probe molecules solubilize in their nonpolar interior and the CMC can be detected by the change in their emission spectrum. However, traditional techniques have poor accuracy and optical techniques are not well-suited for the oily, cloudy fluids typically found in hydrocarbon-producing wells. Moreover, data processing of both traditional and optical data needs to be performed offsite, meaning that critical information such as inhibitor dosing may not be immediately available. Indeed, conventional techniques for management of solid deposition and scaling, and to adjust development and/or inhibitors thereof, is performed by sampling oilfield flow once every few months. Corrosion data is commonly performed by inserting metal coupons into the flow and retrieving them every few months. Inhibitor composition and volume are then adjusted based on laboratory data derived from those samples and coupons. Such conventional techniques are clearly inefficient, and there is a need for a more automated system that could close the loop. Moreover, taking measurements involves significant costs associated with, e.g., shutting down production from the well and personnel visits to the wellsite.

As with corrosion, a mitigation technique for solid accumulation is to add chemical additives to the fluid, and having those chemicals above their CMC is desirable. Scale appears as minerals starting to precipitate in water when the concentration of mineral exceeds its saturation limit. Scale formation is challenging to predict because, for example, when variables such as $Ba^{2+}$ and $SO_4^{2-}$ remain in solution, they do no harm. But a change of some physical property of the water such as its pressure and temperature, or a chemical change such as pH, can change the saturation limit and the scale problem can deteriorate very rapidly. Conventional techniques to predict and measure scaling are deficient for at least the reason that they depend on measuring the physical and chemical properties of the water, rather than direct measurement. More recently, optical techniques have been proposed which rely on interaction of light with particles bigger than a certain size but, by definition, this requires the scale problem to have already significantly commenced. Paramagnetic tools and methods have been proposed to predict some flow assurance problems, such as accumulation of asphaltene, but they cannot effectively measure diamagnetic species (i.e., non-paramagnetic) such as dissolved ions or wax, which can be significant contributors to flow assurance problems.

There is a need for new and improved systems, tools, and methods for measuring the sufficiency of flow assurance inhibitors in fluids, and for using such systems, tools, and methods onsite, particularly with regard to monitoring species that are diamagnetic in their natural state. There is also a need for new and improved systems, tools, and methods for measuring the sufficiency of scale inhibitors and solid deposit inhibitors, and for using such systems, tools, and methods onsite. There is also a need for new and improved systems, tools, and methods for measuring non-paramagnetic components within a fluid and applying those to scale detection and solid deposition in conduits. There is also a need for real-time measurement systems, tools, and methods for detecting properties of an oil-field fluid such as whether inhibitors within that fluid are above or below their CMC.

SUMMARY

In an embodiment is provided a method of determining at least one property of a fluid flowing through a system, the method including inducing a paramagnetic response from at least one diamagnetic species flowing through the system, the fluid including the at least one diamagnetic species; performing electron paramagnetic resonance (EPR) spectroscopy on at least a portion of the fluid to generate an EPR spectrum; and determining at least one property of the fluid based on the EPR spectrum.

In another embodiment is provided a method of determining at least one property of a fluid flowing through a system, the fluid including at least one diamagnetic species, the method including inducing a paramagnetic response that is indicative of a property of the diamagnetic species; performing electron paramagnetic resonance (EPR) spectroscopy on a portion of the fluid to generate an EPR spectrum from the paramagnetic response; and determining at least one property of the fluid based on an attribute of the EPR spectrum.

In another embodiment is provided an apparatus for determining at least one property of a fluid flowing through a system, the apparatus including at least one sensor, the sensor including a source of electromagnetic energy, the source of electromagnetic energy being configured to induce a paramagnetic response from at least one diamagnetic species in the fluid flowing through the system, the fluid including the at least one diamagnetic species; an electron paramagnetic resonance (EPR) spectrometer, the EPR spectrometer being configured to perform EPR spectroscopy on at least a portion of the fluid to generate an EPR spectrum; at least one processor coupled to the EPR spectrometer and the at least one sensor, the at least one processor being configured to determine at least one property of the fluid based on the EPR spectrum; and a conduit through which a fluid flows.

In another embodiment is provided a non-transitory computer-readable medium storing instructions that, when executed on a processor, perform operations for detecting a property of a fluid flowing through a system, the operations including inducing a paramagnetic response from at least one diamagnetic species flowing through the system, the fluid including the at least one diamagnetic species; performing electron paramagnetic resonance (EPR) spectroscopy on at least a portion of the fluid to generate an EPR spectrum; and determining at least one property of the fluid based on the EPR spectrum.

In another embodiment is provided a method of determining at least one property of a first fluid flowing through a system, the method including introducing an inhibitor composition to the first fluid flowing through the system to form a second fluid; performing electron paramagnetic resonance (EPR) spectroscopy on at least a portion of the second fluid to generate an EPR spectrum; and determining at least one property of the second fluid based on the EPR spectrum.

In another embodiment is provided a non-transitory computer-readable medium storing instructions that, when executed on a processor, perform operations for detecting a property of a first fluid flowing through a system, the operations including introducing an inhibitor composition to the first fluid flowing through the system to form a second fluid; performing electron paramagnetic resonance (EPR) spectroscopy on at least a portion of the second fluid to generate an EPR spectrum; and determining at least one property of the second fluid based on the EPR spectrum.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
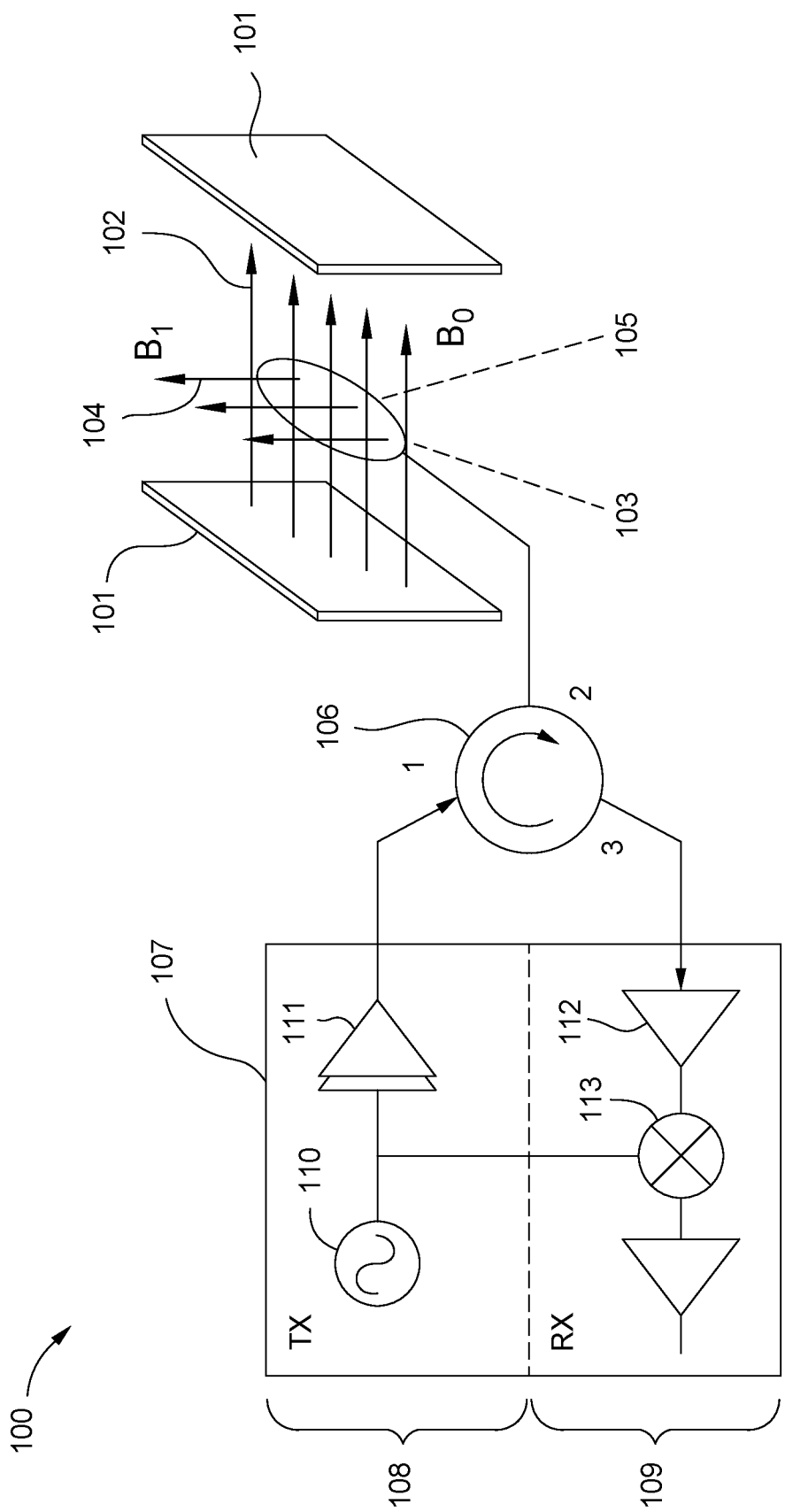
FIG. 1A is a block diagram of an example electron paramagnetic resonance (EPR) spectrometer, in accordance with at least one embodiment of the present disclosure.

The systems, tools, and methods described herein enable measuring certain properties of fluids, such as a quantification of inhibitor micellization in wellbore fluids. In some embodiments, the systems, tools, and methods may provide a sensor that can be deployed at a wellsite and uses paramagnetic techniques to determine levels of an inhibitor such as a surfactant, which, e.g., may have been deployed for scale and/or corrosion inhibition. When in a fluid, the surfactants can form micelles, and the systems, tools, and methods can enable paramagnetic detection of the inhibitor micellization.

The inventors have found that the quantity of corrosion-related chemical species and/or solids deposited on pipe structures can be inferred by electron paramagnetic resonance (EPR) techniques even in cases where the pertinent fluids do not themselves exhibit paramagnetism in their natural state. In contrast to some recently introduced techniques using optical measurements of inhibitor micellization, embodiments of the present disclosure can enable micelle detection in the oily and/or cloudy fluids typically found in hydrocarbon-producing wells. When the fluids become too opaque, optical techniques require samples to be cleaned up by allowing for settling of solids, heating, and/or centrifuging fluids. In contrast, the EPR systems and methods of the present disclosure can avoid such complications for at least the reason that spectra pertinent to micelle formation can be separated from the contribution of metal ions, residual asphaltene, and other materials. Moreover, the measurements and data collection disclosed herein can be performed real-time and on-site, thereby providing a significant advantage over CMC processing using optical reagents. Conventional data processing can take hours or days, while the methods disclosed herein enable data processing in a matter of minutes. Indeed, referring again to the Santa Barbara spill, in that case corrosion-related data had been collected but it was still being evaluated when the breach occurred. Further, as an application of this present disclosure, the data may be made immediately available (e.g., on the Cloud) and users can get instant feedback on the presence of critical micelle concentration (or not) and then make a decision on inhibitor dosing. Further, conventional systems typically provide only a binary answer (a "yes" or "no" to the presence of micelles), whereas analysis of the EPR spin-exchange frequency can provide, at least, a molar amount of micelles.

The systems, tools, and methods described herein can also enable measuring certain properties of fluids, such as the detection of chemical species that do not themselves have paramagnetic signatures, such as wax, paraffin, scale, hydrates, and other ions. It is noted that abundant scale-forming ions include $Ca^{2+}$, $Ba^{2+}$, $Sr^{2+}$, $Na^{2+}$, $K^+$, $CO_3^{2-}$, $SO_4^{2-}$, and $Cl^-$, among others, all of which are diamagnetic in their natural state. The inventors have found that a combination of a radiation source (e.g., a high energy radiation source, such as gamma rays, neutrons, X-rays, terahertz (THz) radiation, ultra-violet radiation, and plasma-beam) and EPR can enable detection of such chemical species that are not naturally paramagnetic themselves (i.e., that were not paramagnetic before being irradiated). In some scenarios, this paramagnetic state can last for months after the radiation has ceased, in other scenarios it can be fleeting. The inventors have found that the addition of certain reagents may create a permanent paramagnetic response indicative of whether the original diamagnetic component had gained temporary paramagnetism. Such reagents are sometimes described as spin-traps. The inventors have also found that even in the absence of irradiation, the addition of certain reagents to the well fluid may create a paramagnetic response that is indicative of the CMC. Such reagents are sometimes described as spin probes.

For purposes of the present application and claims, the terms "pipe," "conduit," and "tubular" are used interchangeably.

Formation, precipitation, and deposition of inorganic (e.g., scale) and/or heavy organic compounds (e.g., asphaltenes) in fluids, such as petroleum fluids, constitute a well-known flow assurance challenge. The problems associated with such deposition include the capital cost of infrastructure, the cost of maintenance and repair from reservoir to refinery, production losses related to shutdowns, chemical costs, and remediation of assurance issues caused by deposition. Preventative actions, such as injection of chemical inhibitors, to control such deposits remain problematic for at least the reason that laboratory experiments often fail to duplicate the behavior of aggregation in situ. The petroleum industry spends greatly on preventative actions, guessing how much inhibitor to add, and typically overdosing on inhibitors. Moreover, there is no real-time feedback on how effective a chemical inhibition program is, and there are no updates over the course of a day as to when to decrease, or increase, the dosage.

Corrosion itself is a multibillion-dollar problem, estimated at over $170 billion in the United States alone. As with solid deposition, corrosion also causes integrity problems over the lifetime of the well, pipeline, and processing systems. Catastrophic failure of the systems due to corrosion can be worse than failure due to solid clogging a pipe because the corrosion failure allows hydrocarbons to escape from the tubular and result in either seen, or unseen, pollution. Other downhole problems can arise due to corrosion, such as breach of pressure integrity from a hydrocarbon zone into a water-bearing aquifer, the effects of which might not be discovered until many years of leakage.

It is very common that oil wells produce water along with hydrocarbons, and that water will contribute to corrosion. The water can dissolve gases such as carbon dioxide ($CO_2$) or hydrogen sulfide ($H_2S$) present in the oil to become acidic, and the increased acidity of the water increases corrosion. Higher temperatures typically accelerate the corrosion rate as does a faster flow and a salinity of the fluid in the oil well. The corrosion may occur anywhere in the system, such as in the tubing string and wellhead.

For many applications pertinent to the energy and environmental industries, it is not possible to directly access the location of corrosion, and instead, inferences of that corrosion may be made by sampling fluid downstream of a corrosion event. Multiple techniques for corrosion sensors have been developed, but most of these require access to the location of corrosion. For long pipelines, the systems, tools, and methods described herein can enable detection of the presence of corrosion anywhere upstream of the sensing device (e.g., by sampling properties of the flowing fluid flowing through the device), which provides significant advantages over conventional systems, tools, and methods.

As noted above, conventional techniques to measure corrosion and to adjust development and/or inhibitors thereof are performed by, e.g., sampling oilfield flow periodically (e.g., once every few months) or by inserting small metal coupons in a controlled environment. Inhibitor composition and/or volume are then adjusted based on laboratory data from those samples. Such conventional techniques are inefficient, and there is a need for a more automated system that could close the loop. Moreover, taking measurements involves significant costs associated with, e.g., shutting down production from the well and personnel visits to the wellsite. The systems, tools, and methods of the present disclosure overcome such problems.

Because of the complexity and safety issues related to extracting samples from pressurized tubulars, it can also be advantageous to measure chemical properties of the fluid in tubulars without involving human intervention to access the fluid. Moreover, a device which measures the fluid continuously and gives an alert, or other indication, when the likelihood of upstream corrosion has been identified would provide significant advantages.

Physical inspection of downhole tubulars can be particularly complicated so the industry largely operates through the use of weight-loss coupons whose corrosion is hoped to be representative of downhole conditions. In some cases, intervention of a wireline tool is possible. For subsea applications, the costs of intervention to retrieve a coupon can be significant, or else multiple streams can be comingled at the surface, making it difficult to determine the location of the corrosion source. Pumping inhibitors is also standard practice, and yet there is no wellsite-installable technology to identify whether the inhibition is sufficient, or maybe wastefully excessive. It has been noted above that maintenance of at inhibitor at its CMC level often gives the optimal assurance, but the industry is in need of a robust measurement to determine the concentration of an inhibitor and whether or not it is above CMC.

In at least one embodiment of the present disclosure, the systems, tools, and/or methods can be complemented by adding traditional measurement parameters used for scale prediction such as those parameters shown in Table 1.

TABLE 1

| | |
|---|---|
| pH | A pH of <7 indicates acidity of the fluid. A lower value of pH generally indicates higher corrosivity. |
| Conductivity | A high conductivity of the fluid generally indicates high corrosivity. |
| Chloride | Chloride acts as an electrolyte in corrosion reactions. Corrosivity of the fluid generally increases with an increased chloride content. |
| Sulfate | Sulfate acts as an electrolyte in corrosion reactions. Corrosivity of the fluid generally increases with increased sulfate content. However, sulfate contributes less to corrosivity than chloride. |
| Hydrogen Sulfide ($H_2S$) | $H_2S$ generally increases corrosivity of the fluid by providing $H^+$ ions. |
| Total Hardness | Generally, as the hardness of the fluid increases, scaling tendency increases. This may contribute to under-deposit corrosion, which is defined as a localized corrosion that develops beneath or around a deposit on a metal surface. |
| Dissolved Oxygen (DO) | High DO content generally indicates high corrosivity. Typically, the DO content is kept at <10 ppb by the use of oxygen scavengers. |
| Dissolved Iron | Dissolved iron content is a measure of corrosion. An increasing trend of iron content can be indicative of increasing corrosion. |
| Total Iron | Total Iron indicates the sum of dissolved iron and insoluble iron compounds. The difference between total and dissolved iron generally indicates the amount of iron compounds formed due to corrosion. |
| Manganese (Mn) | Mn is a major alloying element in carbon steel that is rarely found in reservoir fluids. A high Mn content generally indicates high corrosion. |
| Residual Corrosion Inhibitor | A higher content of residual inhibitor generally indicates decreased corrosivity. A sufficiently high content may be indicated by presence of micelles. |

Within the oil industry, two common mitigation techniques for corrosion are electrical, such as cathodic protection, and chemical inhibition. Cathodic protection entails the application of DC or very low frequency voltage along the well completion to create a potential difference high enough to block oxidation. Such galvanic inhibition is in widespread use to protect structures near the surface or above the seabed. Chemical inhibition, however, is often the preferred solution for corrosion happening along the reservoir section of a completion. Water-soluble corrosion inhibitors can be dosed continuously to maintain a steady concentration of inhibitor, avoiding any loss of production during injection. Oil-soluble corrosion inhibitors can also be used in some applications, such as wells with high velocity fluids. The corrosion inhibitor formulation may be passed between two pigs to obtain complete coverage of the internal surfaces of the pipe wall. Indeed, as noted by "Online monitoring of production process using electron paramagnetic resonance," U.S. Pat. Pub. No. 2019/0302306, by Kulbrandstad and Godoy, the EPR device itself might be conveyed by a pig. The contents of that application are herein incorporated by reference in its entirety.

Chemical corrosion inhibitors are typically complex mixtures made up of many components. Whilst individual active components of the mixtures may have a variety of chemistry types, these components tend to fall into one primary class of chemical categorized herein as surfactants because of their tendency to form micelles at sufficiently high concentration. Surfactants typically contain a functional polar head group and a long hydrocarbon tail, such as in the region of $C_{10}$-$C_{16+}$. Corrosion inhibition can occur by adsorption of the surfactant functional group onto the metal surface, forming a barrier film that prevents water contact with the metal surface, thus hindering the electrochemical corrosion process. After saturation of the metal surface, some remaining surfactant molecules may exist predominantly in the water-phase whereas others may accumulate in the water phase.

Due to the hydrophobic nature of the hydrocarbon tail and the hydrophilic nature of the head group, the surfactant molecules can face energetic repulsions. When these molecules exist above a certain concentration, however, and their local number and proximity are high enough, the molecules will spontaneously form aggregated structures to overcome the repulsions faced in the bulk phase. This structure is called a micelle, and the concentration at which micelles form is known as the critical micelle concentration (CMC). Further addition of surfactant molecules (e.g., increased dose of corrosion inhibitor) may lead to the creation of more micelles without offering significant additional corrosion protection. See SPE 155107 "Micelle Detection for Optimizing Corrosion Inhibitor Dose on an Offshore Platform," presented by Cameron Mackenzie and Emma Perfect at the SPE International Conference & Workshop on Oilfield Corrosion, Aberdeen, 2012, which is herein incorporated by reference in its entirety. For some applications, the optimal inhibitor concentration can be slightly below the CMC, but for an application of imidazoline inhibitors for $CO_2$ corrosion, optimal concentration can be slightly above the CMC. See V. Jovancicevic, S. Ramachandran, P. Prince, "Inhibition of Carbon Dioxide Corrosion of Mild Steel by Imidazolines and Their Precursors," CORROSION, 1999; 55(5): 449-455, which is herein incorporated by reference in its entirety.

To date, the only industrial available micelle detection, however, relies on optical detection of fluorescence in clear fluids, such as disclosed in U.S. Pat. Pub. No. 2016/0238531, U.S. Pat. Nos. 9,359,677, and 9,341,571, all of which are herein incorporated by reference in their entireties. Methods therein identify the presence of micelles which will occur when corrosion inhibitors are present in concentrations above their critical level. However, the techniques typically involve transporting a sample to a chemical laboratory, applying some chemical manipulation such as adding an optical fluorescent marker, and then performing optical analysis to determine whether the CMC has been reached. Such a sequence does not lend itself to an automated workflow that could be installed permanently, with fluid flowing through a sensing device. The systems disclosed therein require site visits and off-line sampling such that no real-time data is possible. Moreover, optical techniques are not well-suited to oily, cloudy fluids such as those typically found in produced fluids. Further, such systems provide only a binary answer (a "yes" or "no" to the presence of micelles), rather than an amount of micelles.

Scaling or scale formation is another flow assurance challenge. Scaling or scale formation generally involves the precipitation and deposition of dense crystalline materials on surfaces made of metal and other materials. Scale formation may occur when inorganic mineral salts (such as, for example, calcium carbonates, calcium sulfates, calcium oxalates, and barium sulfates) precipitate from liquids and deposit on the inside surfaces of a system (such as, for example, boilers, evaporators, reactors, cooling water systems, heat exchangers, pipes, filter cloths, reverse osmosis membrane surfaces, oil wells, and desalination evaporators). Scale formation may cause a number of operational problems including equipment plugging, pressure loss, increased utility costs, reduced heat exchange capacity, corrosion, lost production due to downtime, and downgraded products from insufficient feeds. Scaling of equipment may occur in a variety of industries, for example, in paper pulp manufacture, in the chemical and petrochemical industry, in power generation, and in water treatment.

In the petroleum industry, scale deposition costs millions of dollars each year, is a leading cause in production decline worldwide, and is recognized as one of the top flow assurance problems in regions that are prone to scale, such as the North Sea, the United States, and Canada. Scale can be deposited in equipment along water paths such as piping, injectors, reservoirs, and surface equipment. Scale formation at oil-producing wells may eventually result in lower oil yields and in well failure. Scale found in oil fields typically forms by direct precipitation from naturally occurring water in reservoir rocks and/or as a result of produced water becoming oversaturated with scale-forming species when two incompatible waters combine. Scaling can also occur when an oil or gas well produces water and/or water injection is used to enhance oil and gas recovery. Additionally, temperature changes, pressure changes, pH shifts, and outgassing may cause the water to become oversaturated with scale-prone species and lead to the formation of, or increase the severity of, scales.

Natural water in oilfields may contain dissolved substances acquired through contact with mineral phases in the natural environment. Deep subsurface water may be enriched in soluble ions through alteration and dissolution of minerals. The water in sandstone reservoirs or geological formation water that have contact with brine sources may contain abundant scale-forming ions, such as $Ca^{2+}$, $Mg^{2+}$, $Ba^{2+}$, $Sr^{2+}$, $Na^{2+}$, $K^+$, $CO_3^{2-}$, $SO_4^{2-}$, and $Cl^-$. Seawater is also generally rich in scale-forming ions, such as ions that are byproducts of marine life and water evaporation. In offshore oil production, the formation of sulfate scales may occur when seawater (which may be rich with $SO_4^{2-}$) is mixed with formation water (which may contain high concentrations of barium and calcium). Oilfield scale may form with great rapidity when the state of a natural fluid is perturbed such that the solubility limit for one or more components is exceeded.

Barium and strontium sulfate scales may, for example, be particularly troublesome when sulfate-rich seawater is used as an injection fluid in oil wells whose formation water is rich in barium ions. Barium and strontium sulfate generally form very hard, very insoluble scales that can be difficult to prevent by conventional chemical-based scale-inhibition techniques. In some instances, this can be particularly troublesome as barium and strontium sulfates can be co-precipitated with radium sulfate, making the scale mildly radioactive. Dissolution of sulfate scales in piping is generally difficult, possibly entailing one or more of high pH, long contact times, heat, high pressure, and high velocity circulation. Barium sulfate, or other inorganic supersaturated salts, may precipitate onto the formation to form a scale, thereby clogging the formation and restricting the recovery of oil from the reservoir. The insoluble salts may also precipitate onto production tubing surfaces and associated extraction equipment that may, for instance, limit productivity, limit production efficiency, and compromise safety. Certain oil-containing formation waters are known to contain high barium concentrations of 400 ppm and higher. Since barium sulfate forms a particularly insoluble salt, the solubility of which declines rapidly with temperature, it may be difficult to inhibit scale formation and to prevent plugging of the oil formation and topside processes and safety equipment.

Measurement of scale components in produced fluids has been investigated through the use of optical and infrared techniques such as Fourier-transform infrared (FT-IR) spectroscopy. Other measurements are chronicled by P. Rostron in "Critical Review of Pipeline Scale Measurement Technologies," MOJ Mining and Metallurgy, 2018 1(1), which is herein incorporated by reference in its entirety. As an example, Rostron discloses the use of gamma rays and neutrons to measure the density and thickness of scale buildup inside a pipe.

The combination of gamma ray (and related) energy with paramagnetism has been disclosed for dosimetry applications, e.g., by M. A. H. Rushdi, A. A. Abdel-Fattah and Y. S. Soliman, "Physico-chemical studies for strontium sulfate radiation dosimeter," Journal of Radiation Research and Applied Sciences, Volume 8, Issue 2, April 2015, Pages 221-225, which is herein incorporated by reference in its entirety. Rushdi observes that when anhydrous strontium sulfate ($SrSO_4$) is subjected to gamma rays, there is a linear relationship between its paramagnetic signal strength and the amount of gamma rays absorbed by the chemical. Their application is to develop a dosimeter for low dose applications.

Gamma-ray induced paramagnetism is also discussed by Gelardi F., Agnello S., "Gamma rays Induced Conversion of Native Defects in Natural Silica" in: Pacchioni G., Skuja L., Griscom, D. L. (eds) Defects in $SiO_2$ and Related Dielectrics: Science and Technology. NATO Science Series (Series II: Mathematical and Physical Chemistry), Vol. 2. Springer, Dordrecht, 2000, which is herein incorporated by reference in its entirety. Gelardi considers the use of gamma rays to identify defects in silicon wafers by converting a diamagnetic "hole" into one that is paramagnetic.

Another technique that is relatively common to examine scaling is X-ray fluorescence (XRF). When materials are exposed to short-wavelength X-rays or to gamma rays, ionization of the materials' component atoms may take place. Ionization consists of the ejection of one or more electrons from the atom, and may occur if the atom is exposed to radiation with an energy greater than its ionization energy. X-rays and gamma rays can be energetic enough to expel tightly held electrons from the inner orbitals of the atom. The removal of an electron in this way makes the electronic structure of the atom unstable, and electrons in higher orbitals "fall" into the lower orbital to fill the hole left behind. In falling, energy is released in the form of a photon, the energy of which is equal to the energy difference of the two orbitals involved. Thus, the material emits radiation, which has energy characteristic of the atoms present. The term "fluorescence" is applied to phenomena in which the absorption of radiation of a specific energy results in the re-emission of radiation of a different energy (generally lower). It is noted that some organic chemicals such as alpha-phenyl N-tertiary-butyl nitrone (PBN) and 5,5-dimethyl-pyrroline N-oxide (DMPO) and 3,5-dibromo-4-nitrosobenzenesulfonic acid (DBNBS) and 5-Diisopropoxyphosphoryl-5-methyl-1-pyrroline-N-oxide (DIPPMPO) have the property that the energy generated by a nearby decaying atom can be "trapped" within those molecules such that their paramagnetic signature changes after irradiation by the fluorescing molecule. Such organic molecules are often termed spin-traps and form a subset of organic molecules known as spin probes. The use of different spin probes is envisaged by at least one embodiment of the present disclosure, wherein that spin probe will provide an EPR signature through chemical or physical interaction with the fluids surrounding it.

Previously published detection methods relying on EPR techniques are not immediately pertinent to many important flow assurance problems related to scale accumulation because the key chemical species that are flowing in the well are not paramagnetic, i.e., they are diamagnetic.

Autonomous chemical-sensing devices have been disclosed for oilfield applications, such as those that use electron paramagnetic resonance (EPR). These include U.S. Pat. Pub. No. 2016/0223478 to Babakhani et al., filed Sep. 25, 2014 and entitled "EPR Systems for Flow Assurance and Logging"; U.S. Pat. Pub. No. 2018/0224414 to Kulbrandstad et al., filed Feb. 7, 2018 and entitled "Online Monitoring of Production Processes Using Electron Paramagnetic Resonance (EPR)"; U.S. patent application Ser. No. 15/875,823, filed Jan. 19, 2018 and issued as U.S. Pat. No. 10,564,308; and International Patent Application Publication No. 2016/187300A1, filed May 18, 2016 and entitled "Electron Paramagnetic Resonance (EPR) Systems with Active Cancellation," all of which are herein incorporated by reference in their entireties. These EPR-related disclosures detail how sensors can be developed which can be fluidically connected to oilfield tubulars, wellheads, etc. and give real-time sensing data. These documents describe that individual electrons within the pipe can be resonated by a swept Tesla field to give a spectral decomposition of each molecule. The documents disclose apparatus that can digitize chemical molecules and/or nanoparticles in real-time as they flow through oilfield hardware, and then can transmit that information (e.g., to the Cloud) where this information can drive flow assurance and enhanced oil recovery programs, which may in some cases be artificial intelligence (AI)-based. The transmitted spectra capture the unique chemical contribution of that paramagnetic molecule or nanoparticle. The apparatus, however, would be completely blind to non-paramagnetic components, but the inventors have determined adding a radiation component to the apparatus then the same cloud and AI-based techniques remain applicable. Indeed, no conventional methods have contemplated the use of a radiation source—such as gamma rays, neutrons, X-rays, THz radiation, ultra-violet radiation, and plasma-beam—to make detectable by EPR a chemical species in a flowing fluid where that species is nonparamagnetic in its natural state.

Electron Paramagnetic Resonance

Electron Paramagnetic Resonance is a technique to derive paramagnetic characteristics of materials by exposing the materials to a combination of magnetic and electromagnetic fields that induces resonance of unpaired electrons within those materials. Discussion of EPR principles and techniques can be found in, for example, J. A. Weil and J. R. Bolton, Electron Paramagnetic Resonance: Elementary Theory and Practical Applications, John Wiley & Sons, 2007; Gilbert et al., Electron Paramagnetic Resonance, Volume 20, The Royal Society of Chemistry, Cambridge UK 2007; A. Schweiger and G. Jeschke, Principles of Pulse Electron Paramagnetic Resonance, Oxford University Press, 2001; and G. R. Eaton, S. S. Eaton, D. P. Barr, and R. T. Weber, Quantitative EPR, Springer Vienna, 2010, all of which are herein incorporated by reference in their entireties.

FIG. 1A is a block diagram of an example EPR spectrometer 100, in accordance with at least one embodiment of the present disclosure. The EPR spectrometer 100 may generally use building blocks similar to those of a traditional EPR spectrometer. For example, the EPR spectrometer 100 may include one or more magnets 101, a resonator cavity 103, and a transceiver 107, which includes both transmit (TX) circuitry 108 and receive (RX) circuitry 109 (also referred to as a transmitter and a receiver, respectively). For certain embodiments, the EPR spectrometer 100 may be a permanently fixed EPR device, while in other embodiments, the EPR spectrometer 100 may be a mobile EPR device. Such a mobile EPR device may be capable of traversing a length of a conduit, either inside or outside of the conduit. A mobile EPR device may take measurements while stationary or while traversing the conduit.

In at least one embodiment, the transceiver 107 may be a microwave transceiver, operating at frequencies between 300 MHz and 300 GHz, for example. The TX circuitry 108 may include a frequency synthesizer 110 and a power amplifier 111 coupled between the output of the frequency synthesizer 110 and a circulator 106 (e.g., at port 1 thereof). The TX circuitry 108 is coupled to the resonator cavity 103 via the circulator 106, so that the energy of the source transmission does not overwhelm the sensitive circuits of the RX circuitry 109. The output of the circulator 106 (e.g., at port 2) passes to the resonator cavity 103, which creates a radio frequency (RF) electromagnetic field 104 ($B_1$ field) whose magnetic component is largely perpendicular to that of the static DC magnetic field 102 ($B_0$ field or Zeeman field).

A magnetic field generator provides the DC magnetic field 102 utilizing magnets 101, coils, or the like. The resonator cavity 103 and sample chamber 105 therein are placed inside the magnets 101 and/or coils that generate the DC magnetic field $B_0$. The sample chamber 105 is designed to allow fluids to flow therethrough. The fluid flow might be that of a full tubular in wellsite equipment or a side-stream to which a subset of the main flow has been directed. In a downhole apparatus, the fluid flow might be that coming from a specific interval of the reservoir, such as directed by a downhole control valve or similar device. The presence of the Zeeman field introduces an energy difference $\Delta E$ between the two spin states of an unpaired electron: parallel and anti-parallel to $B_0$, with $\Delta E$ being proportional to $B_0$. At its resonant frequency, the resonator 103 produces the RF magnetic field $B_1$. Using the notation h for the Planck constant, then at that RF frequency (f) where hf equals $\Delta E$ (i.e., the Larmor frequency), spin transitions between the two up and down spin states occur, resulting in absorption of RF energy in the sample. In a reflection-type resonator, this results in a change in the level of reflected power from the resonator. This reflected power from the resonator is coupled to the receiver via the circulator 106 (e.g., at port 3). For some embodiments, the receiver may include a low noise amplifier (LNA) 112, a mixer 113 coupled to the output of the LNA 112 and the output of the frequency synthesizer 110, and an amplifier 114 coupled to the output of the mixer 113.

As noted by International Patent Application Publication No. 2016187300 to Babakhani et al., entitled "Electron Paramagnetic Resonance (EPR) Systems with Active Cancellation" and filed May 18, 2016, the circulator might not provide complete isolation between the TX and RX circuitry, in which case an active cancellation component may be added to the EPR spectrometer. WO 2016187300 is herein incorporated by reference in its entirety.

The resonator cavity 103 may be excited with continuous wave or pulsed excitation. In one aspect, the EPR sensor is a sensor that operates at 1 GHz or higher. In some embodiments, the EPR sensor may operate at lower frequencies. For at least one embodiment, the EPR sensor may operate in the range of 3-5 GHz. A further discussion of EPR and its use for online monitoring can be found in U.S. Pat. Pub. No. 2019/0302306 which is herein incorporated by reference in its entirety.

For at least micelles, scale, and solids (e.g., asphaltene) quantification, wellbore fluid may pass to the resonator under pressure from the wellhead via a pressure-containing tube called a side stream, and then the wellbore fluid may return from the resonator back to the surface tubing via a second side stream. The magnitude of the DC field may be swept by solenoids that can achieve up to 0.25 Tesla, 1.5 Tesla or higher.

A transceiver assembly may be used to power the device. This assembly may send a DC field to the solenoid at a high current value, as well as an RF field to the resonator (e.g. at ~4 GHz for at least one embodiment). The precise resonance frequency may depend on the material inside the resonator. An analysis of that frequency may give the permittivity of the fluid, while an analysis of the resonator Q may give the conductivity of that fluid. Thus, the device may not yield just an EPR signal, but may also give some indication of fluid parameters such as fluid conductivity. Fluid conductivity can be a useful indicator of, e.g., corrosion and scaling. Further fluid conductivity can also have an impact on size and aggregation count of micelles. In some embodiments, the output to the transceiver may be sent to an external power converter (not shown) that may be, itself, hooked up to a solar panel and/or wireless communication. In this way, the device can operate independently and transmit its data (e.g., to a cloud server in a network), where the data is amenable to advanced analytics and processing.

Thus, and in some embodiments, the methods described may be used to measure, directly or indirectly, species that have naturally have paramagnetic attributes (e.g., asphaltene) and those such as micelles, scaling, and solid deposits that do not. Further, the methods described herein may be used to identify the percentage of such species in a fluid, which leads to solutions for those pipes that would otherwise suffer from corrosion and solid deposits. An embodiment of the invention is a method and apparatus that will use a secondary mechanisms to measure EPR properties on a chemical without an EPR attribute. However, many ions do have an EPR attribute. In this context an attribute of the EPR spectrum, can be the number of peaks, the separation between peaks, the separation between zero-crossings, etc., as well as other attributes that are standard practice for EPR spectroscopy.

Figure 1B:
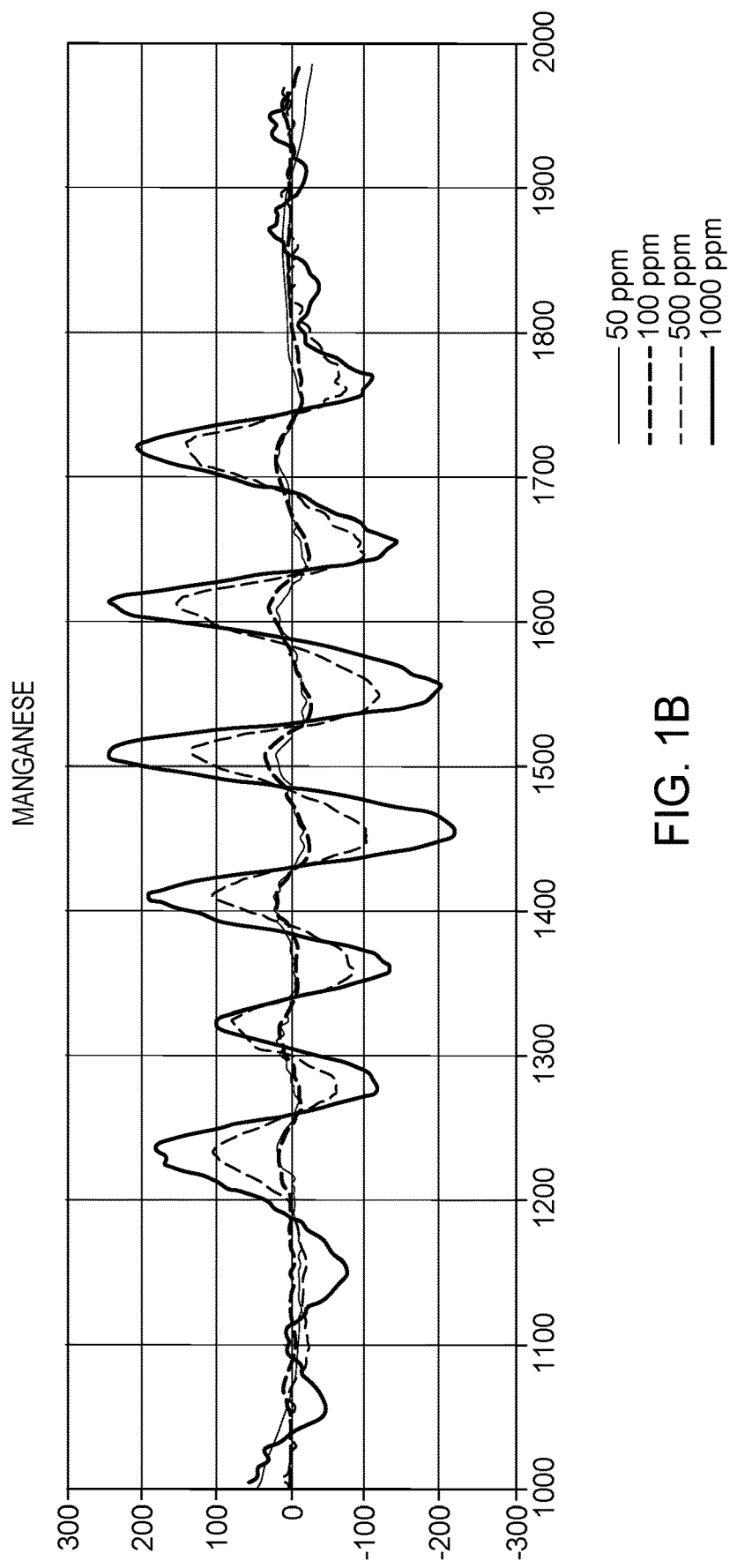
FIG. 1B is an example of an EPR spectrum for dissolved manganese chloride at different concentrations.

For example, EPR can measure concentrations of $Fe^{3+}$, $Mn^{2+}$, and other dissolved ions that result from corrosion. FIG. 1B shows an example of an EPR spectrum for dissolved manganese chloride at different concentrations. Such data would be available in real-time within operator intervention.

One method that is already disclosed is to fluidically connect an EPR device to the tubular, measure corrosion byproducts, and then adjust the dosage of chemical inhibition so as to minimize the presence of these byproducts. For example, see U.S. Patent Application Pub. No. 2018/0120390 to Babakhani and Yang, which is herein incorporated by reference in its entirety.

As shown in FIG. 1B, the EPR device provides a spectrum with two particular attributes, specifically the number of peaks separated by a particular relative magnetic field strength. In the case of Mn', there will be six peaks as shown. This translates to the interaction of outer orbital electrons with nearby magnetic moments, specifically in this case to its "5/2" nuclear spin. More generally, hyperfine coupling may appear whenever there is significant interaction between independent magnetic moments such as arising from the spins of both the nucleus and electrons in atoms. The distance between the peaks is called the hyperfine constant. Such multiplicity of lines is extremely common with some organic molecules called spin probes, such as nitroxide-based spin probes. Other components generate hyperfine signatures. Indeed, that is particularly the case for a class of reagents called spin probes. Thus, the EPR system can derive spectra for dissolved metal salts and ions, such as Mn' and Fe' in an aqueous environment.

Using such a configuration, such as that shown in FIG. 1A, and in some embodiments, ions of transition metals (manganese, iron, copper, and vanadium) dissolved in fluids can be identified. This can enable corrosion and scale management as well as in water-treatment applications for fracturing, disposal, etc. In some embodiments, then, an EPR spectrum of ions of measured fluid would give a real-time indication of any changes in dissolved manganese which, in turn, could be indicative of metal dissolution from wellbore tubulars upstream, e.g., corrosion.

In some circumstances, however, the corrosion ions might not be distinguishable from chemical species already flowing in the well, and other corrosion ions may not be detected at all. For example, many reservoir fluids around the world contain appreciable content of dissolved $Fe^{2+}$ and $Fe^{3+}$ ions. The $Fe^{3+}$ components is paramagnetic, but the $Fe^{2+}$ component is diamagnetic. When the corrosion is caused by biological or acid activity then the produced $Fe^{2+}$ tends to be dramatically higher percentage that the $Fe^{3+}$. Corrosion compounds containing suspensions of (solid) $Fe_3O_4$ are also paramagnetic. It is thus common that an EPR device would measure some unknown percentage of the total iron content, rather than dissolved iron content. Even in the presence of corrosion, the change in percentage of dissolved transition metals ions might be very small, maybe less than natural changes of ions in produced water. Because corrosion is essentially a slow problem (months not minutes), at least one embodiment for corrosion could be a configuration that would use measurements on an episodic basis, rather than continuous data (e.g., to the Cloud). Thus, and in some embodiments, measurements can be performed on an episodic basis, such as once a week, once per month, etc.

It is also not always the case that corrosion can be 100% corrected because the use of inhibitors could be cost-prohibitive. In this case, it may be preferable to find an optimal dosage so that corrosion is delayed for as long as practical. It has been established that this dosage level can be indicated by the presence of micelles in surface-produced fluid. Thus, and in at least one embodiment, measurements can be performed to detect the presence of micelles, the concentration of inhibitor, or a combination thereof.

Inhibitors

In some embodiments, chemical inhibitors used herein can themselves have a paramagnetic signature. Alternatively, in at least one embodiment, the inhibitor can be mixed with a reagent, such as a spin probe, to give a measurable EPR response. A spin probe can be used when the inhibitor does not have a paramagnetic signature itself. The fluid entering the EPR device can be a mix of downhole fluid and additional reagents. In particular, in this manner, an EPR device can detect, at least, the presence of the inhibition and/or whether or not that inhibitor is forming micelles. The presence or absence of those micelles can be monitored in real-time to confirm that the level of inhibitor at the surface is near the CMC. In at least one embodiment, the inhibitor concentration can be below the CMC, at the CMC, or above the CMC. Applications for monitoring micelles include a variety of flow assurance problems such as scale, hydrate, biogenesis, solid deposits, and corrosion.

Some corrosion inhibitors can have an EPR signature, such as those that include metallo-organic components. For example, consider some of the inhibitors discussed in "Novel Metallo-Organic Corrosion Inhibitors for Mild Steel and Aluminium Alloys in Aqueous Solutions and Sol-Gel Coatings," by Volkan Cicek, Ph. D. Dissertation, Oklahoma State University, July 2008, which is herein incorporated by reference in its entirety. Cicek observes that chromates are known to form inhibitors. It is also known that chromium ions have a readily identified EPR signature. However, mobility of aqueous $Cr^{6+}$ and related ions within biological systems and their reactivity with biochemical oxidation mediators make chromates both highly toxic and carcinogenic. They are generally regarded as very hazardous soil and groundwater pollutants. Indeed, EPR is commonly used as a technique to identify chromium contamination. Nonetheless, some chromium compounds are in use in the oil industry, such as sodium dichromate, which is used as a corrosion inhibitor in some drilling muds. Other inhibitors disclosed by Cicek can also be reviewed for the EPR signature and inhibition ability. Inhibitors having metallo-organic components can be used in systems, tools, and methods described herein.

Other corrosion inhibitors include magnetic nanoparticle inhibitors, and such inhibitors can have a characteristic EPR signature due to the magnetic nanoparticles. See, e.g., "Protection of Petroleum Pipeline Carbon Steel Alloys with New Modified Core-Shell Magnetite Nanogel against Corrosion in Acidic Medium," G. El Mahdy, A. M. Atta, A. K. F. Dyab, and H. A. Al-Lohedan, *Journal of Chemistry, Volume* 2013; "Novel dispersed magnetite core—shell nanogel polymers as corrosion inhibitors for carbon steel in acidic medium," Ayman M. Atta, Olfat E. El-Azabawy, H. S. Ismail, M. A. Hegazy, *Corrosion Science*, Volume 53, Issue 5, May 2011, pp 1680-1689; and "Magnetite nanoparticles/polyvinyl pyrrolidone stabilized system for corrosion inhibition of carbon steel," by Eman A. Khamis, Amal Hamdy, Rania E. Morsi, *Egyptian Journal of Petroleum*, 2018, all of which are herein incorporated by reference in their entireties. Magnetic nanoparticle inhibitors can be used in systems, tools, and methods described herein.

More generally, any metal ligand can have a strong EPR signature, and many such ligands are in use as corrosion inhibitors. See, e.g., Pooja Singh, Ashish Kumar Singh, and Vinod P. Singh, "Synthesis, structural and corrosion inhibition properties of some transition metal(II) complexes with o-hydroxyacetophenone-2-thiophenoyl hydrazine," *Polyhedron* 65:73-81 November 2013; and Kamal Y. El-Baradie, Nadia A. El-Wakiel, Hoda A. El-Ghamry, "Synthesis, characterization and corrosion inhibition in acid medium of 1-histidine Schiff base complexes," *Applied OrganoMetallic Chemistry*, Volume 29, Issue 3, March 2015, pp 117-125, all of which are herein incorporated by reference in their entireties. Such corrosion inhibitors can be used in systems, tools, and methods described herein.

Schiff bases are also commonly pursued as potential inhibitors. See, e.g., Dalia M. Jamil, Ahmed K. Al-Okbi, Shaimaa B. Al-Baghdadi, Ahmed A. Al-Amiery, Abdulhadi Kadhim, Tayser Sumer Gaaz, Abdul Amir H. Kadhum, and Abu Bakar Mohamad, "Experimental and theoretical studies of Schiff bases as corrosion inhibitors," Chem Cent J. 2018, 12:7; A. M. Nassar, A. M. Hassan, M. A. Shoeib, and A. N. El kmash, "Synthesis, Characterization and Anticorrosion Studies of New Homo-bimetallic Co(II), Ni(II), Cu(II), and Zn(II) Schiff Base Complexes," *J Bio Tribo Corros* (2015), 1:19; and Ismail Aiad and Nabel A. Negm, "Some Corrosion Inhibitors Based on Schiff Base Surfactants for Mild Steel Equipments," *Journal of Dispersion Science and Technology*, Vol 30, 2009, issue 8, pp 1142-1147, all of which are herein incorporated by reference in their entireties. Schiff base-type inhibitors can be used in systems, tools, and methods described herein.

Detection of micelles of Schiff bases has also been studied. See, e.g., C. Wang, Yinpeng Li, Wen Zhou, "Synthesis of Schiff Base Surfactants and Their Corrosion Inhibition Effect on Tubing Steel in Deep Oil Wells," *Int. J. Electrochem. Sci.*, 11 (2016) 4399-4409, which is herein incorporated by reference in its entirety. Some chromium compounds have also been known to exhibit a measurably different EPR response when in the form of micelles.

Metal porphyrins are also known to have a strong EPR signature for suitable choices of metal chelate (iron, manganese, etc.) and good performance as a corrosion inhibitor. For example, see the many chemicals proposed in "Porphyrins as Corrosion Inhibitors" by Frederick R. Longo, U.S. Navy REPORT NO. NADC-84167-60, 1984, which is herein incorporated by reference in its entirety. Not all metal porphyrins are paramagnetic, however; e.g., see discussion pp 460-473 in "Porphyrins and Metalloporphyrins" by Kevin Smith, Elsevier Scientific Publishing Company, 1975, which is herein incorporated by reference in its entirety. Metal porphyrin-type inhibitors can be used in systems, tools, and methods described herein.

It is not only corrosion inhibitors that produce micelles. While corrosion inhibitors are often amine-based, such as with quaternary amines or fatty acid imidazolines, those for scales tend to be polymeric or based on phosphonate acid. Polymeric inhibitors and phosphonate acid-type inhibitors may be used in systems, tools, and methods described herein. What such molecules have in common though is that sufficient inhibition occurs when the inhibitors form micelles. Similar to inhibiting corrosion, the inhibition of solids, scale, hydrates, and biogenetic species are flow assurance challenges. Consequently, at least some embodiments described herein may be applied to important applications beyond corrosion.

In at least some embodiments, an inhibitor may be one in which the inhibitor provides a measurable EPR signal and which gives a different signature when in the form of micelles. Inhibitors may also be ecologically friendly and cost-effective.

In some embodiments, inhibitors such as surfactants may be injected into conduits (e.g., pipe structures, tubulars, etc.) having the fluid therein. The inhibitors may have a hydrophobic end (or "moiety") and a hydrophilic moiety. The surfactants may be tailored for the specific application at issue. For example, to disperse asphaltene, the hydrophobic moiety may attach to the asphaltene, whereas the hydrophilic moiety may dissolve in water and so it transports asphaltenes to the surface. For corrosion and scale applications, the hydrophobic end may be designed to attach to the interior conduit surface and thereby can present a barrier to chemical attach.

The choice of a surfactant as an inhibitor may depend on factors such as the metal, the solid deposits, scale, and the composition of the corroding medium. Surfactants impart their inhibition action through adsorption at the metal/solution interface. Usually, the hydrophilic moiety of the surfactant adsorbs on the metal surface, while the hydrophobic moiety extends along the solution face. The extent and mode of adsorption depend on the type of interaction between the metal and the surfactant molecule. Chemical adsorption takes place through charge transfer between certain delocalized 7c-electrons of the molecule and the empty d-orbital of the iron surface atom. Physical adsorption takes place through Van der Waals forces or electrostatic attraction.

The physical nature of these chemicals having both hydrophilic and hydrophobic moieties bestows the ability to reduce surface tension of solutions and to self-aggregate into colloids known as micelles. As presented above, a micelle is an aggregation of surfactant molecules in a colloidal suspension. A typical micelle in a corrosion inhibitor forms with the hydrophilic head regions in contact with the water and the hydrophobic aliphatic tail regions buried in the inner portion of the micelle. Typically, useful surfactants are soluble to some degree in aqueous solution and only aggregate into micelles when the surfactants reach the CMC.

While commercially classified by their use, surfactants are also commonly classified based on their dissociation in water, which will influence their interaction with other species in the well flow. Anionic surfactants dissociate in water into an amphiphilic anion (negative charge) and a simple cation (e.g., Na+, K+). Anionic surfactants are the most commonly used surfactants, accounting for about 50% of the world's production. Nonionic surfactants account for approximately 45% of all surfactants. These agents do not ionize in solution and typically have a hydrophilic group composed of an alcohol, phenol, ether, ester, or amide. Many nonionic surfactants contain polyethylene glycol chains. Cationic surfactants form an amphiphilic cation and an anion in aqueous solution. Often this class contains nitrogen compounds such as fatty amine salts of quaternary ammoniums linked to one or more long chain alkyl hydrophobic moieties. The remaining surfactants are either non-ionic or zwitterionic (having both anionic and cationic components). Non-ionic surfactants do see use as corrosion inhibitors in some scenarios, as well as the more common cationic surfactants and anionic surfactants. See Lin-Guang Q., An-Jian X. and Yu-Hua S., *Appl Surf Sci.*, 246 (2005) 1; Driver, R. and Meakins, R. J., Br. Corr. J, 12 (1977) 46; Hosseini, M., Mertens, S. F. L., and Arhadi, M. R., Corr Sci., 45(2003) 1473; Mu, G. N., Zhao, T. P., Liu M. and Gu T., Corrosion, 52 (1996) 853; Elachouri, M., Hajji, M. S., Salem, M., Kertit, S., Aride, J., Coudert R. and Essassi, E. Corrosion, 52(1996) 103; and M. M. Osman and M. N. Shalaby, Anti-Con. Meth. Mat., 44 (1997) 318, all of which are herein incorporated by reference in their entireties.

The inherently polar nature of the surfactant means that as the micelle is formed, a larger percentage of one ion (e.g., cation) will be hidden in the center of the micelle, so other compounds in the water will find themselves exposed to an increase in anions (i.e., of the opposite polarity).

Figure 2A:
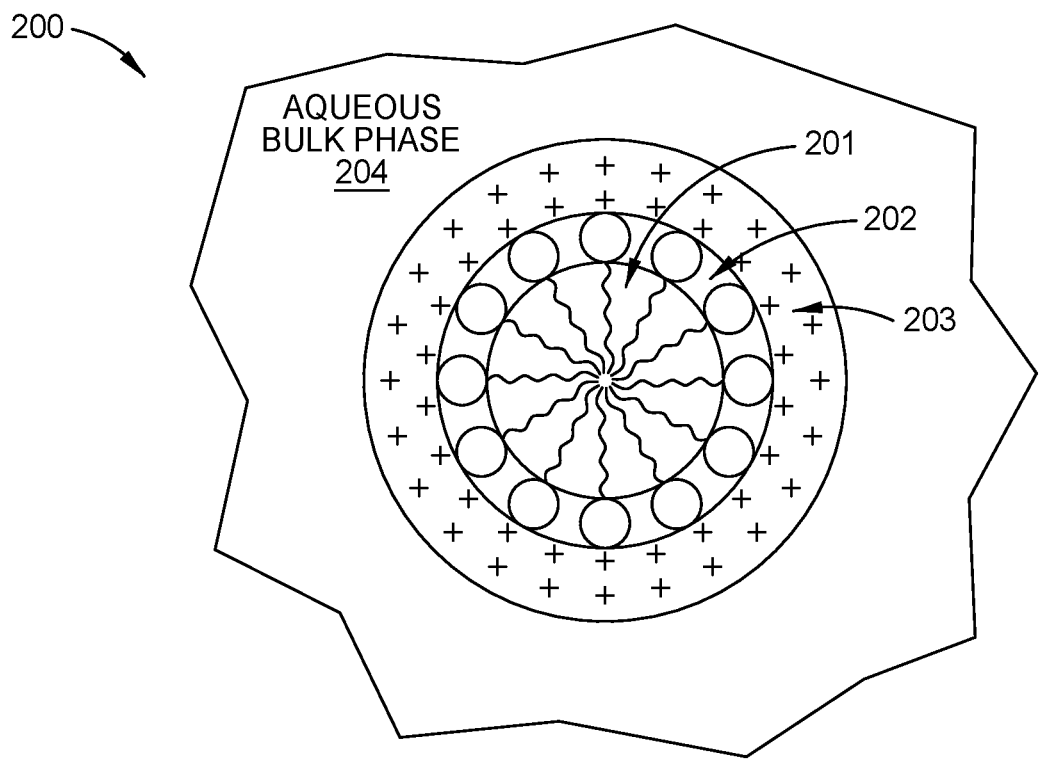
FIG. 2A is an example illustration of layers of a micelle.

From an electrochemical sensing perspective, and according to some embodiments of the present disclosure, the polarity effects of micelles can be considered when performing methods described herein. As shown in FIG. 2A, surfactants can form a polar complex 200 in aqueous solution with a layer of counterions around the micelle. The electric charge in ionic micelles can be neutralized by counterions in the electrical double layer around it. Numeral 201 indicates the core of the micelle. The first layer 202 immediately adjacent to its surface is called the Stern layer. In this layer, counterions can be adsorbed so strongly that there is no thermal agitation and the counterions migrate simultaneously with the colloidal micelle in an electrical field. According to the most widely accepted model, head groups of surfactant molecules are also located in this layer. The rest of the double layer 203 is named after Gouy-Chapman and is also called the diffuse layer since the ions are diffused into the bulk solution 204 due to thermal motion. The core radius is about the length of the fully extended alkyl chain of the amphiphile. The core is assumed to consist of two regions, namely the inner and outer core. The outer core contains approximately the first four methylene groups. There is also another defined region within micelles called a palisade layer that includes the head groups. The degree of counterion dissociation creates a small but detectable magnetic effect which can be resolved with electron paramagnetic resonance if, for example, a suitable reagent (e.g., a spin probe) has been added to the fluid.

As discussed above, the surfactant concentration sufficient to form micelles is known as the CMC, and optimal efficiency of inhibition can be achieved when the concentration of surfactant is at, or slightly above, the CMC. Consequently, derivation of the CMC can be a key parameter in flow assurance with surfactants. A standard technique to derive the CMC depends on the surface tension of a fluid to which the surfactant is added. At low concentrations, the surface tension of the fluid changes with addition of a surfactant, whereas once the CMC is reached, the change is much less pronounced. A plot of surface tension versus concentration would thus give an "elbow" shape at the CMC. This technique to derive the CMC is not well-suited for oilfield applications, and so, other approaches have been considered over the years.

Reagents/Spin Probes

Chemicals without EPR signatures can be detected with an EPR device by bonding or otherwise associating that chemical with a molecule known as a spin probe. See, e.g., U.S. Pat. Pub. No. 2013/0236983, which is herein incorporated by reference in its entirety. In at least some embodiments, the methods herein may be used to monitor inhibitors that do not naturally have a paramagnetic signature. A related technique, using magnetic resonance imaging (MM), was proposed in U.S. Pat. No. 5,560,903, which is herein incorporated by reference in its entirety.

In some embodiments, the reagent added to the fluid may create a paramagnetic signature that is itself indicative of micelle creation, thereby providing a direct indication of the amount of inhibitor. Non-limiting examples of reagents may include spin probes, such as nitroxide spin probes, such as 5-doxylstearic acid methyl ester (5DSE) and 16-doxylstearic acid methyl ester (16DSE) shown in Scheme 1. The nitroxide radical is shown with a black dot. The relatively unreactive N—O group contains an unpaired electron necessary to create the EPR signal, but it is the reactive functional group on the other end of the molecule that provides the chemical handle needed to prepare useful spin labels. Indeed, it is a common characteristic of spin probes that one functionality of the probe provides chemical bonding to the desired target while a different part of the probe provides the EPR response.

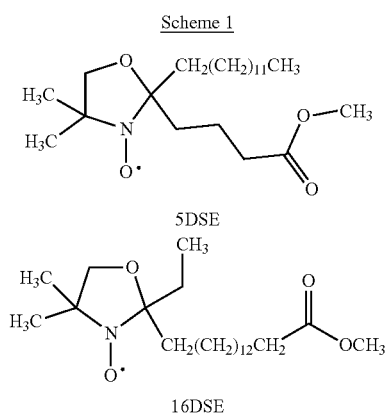

Scheme 1

Figure 2B:
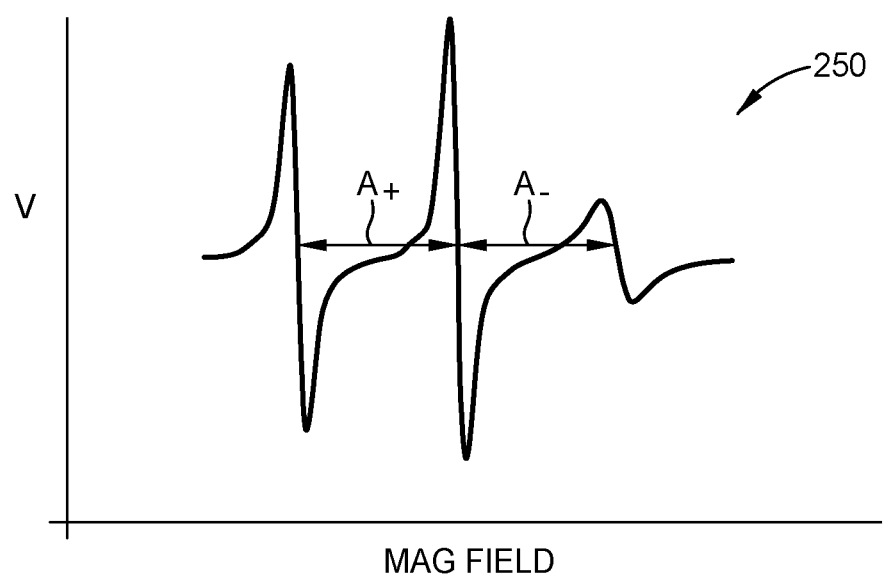
FIG. 2B shows an example EPR spectrum of an example spin probe.

5DSE has a characteristic paramagnetic signature that varies with the degree of counter-ion dissociation of nearby micelles. See, e.g., Bales, B. L. "A Definition of the Degree of Ionization of a Micelle Based on Its Aggregation Number," J. Phys. Chem. B 2001, 105, 6798-6804, which is herein incorporated by reference in its entirety. A typical EPR spectrum 250 for 5DSE is shown in FIG. 2B. The separation between the first and second peaks is the measurement of interest and gives the desired hyperfine coupling constant, A+. The distance between the two zero crossings (in this case labelled A+ and A−) may be indicative of the polar structures near the molecule. 16DSE also has similar characteristics.

The hyperfine coupling constant is sensitive to the average fraction of the volume occupied by water in the region of the nitroxide moiety that is located, on average, near the micelle surface. Monitoring changes in the hyperfine constant over time can enable direct determination of changes in micelle concentration. More specifically, a spin exchange between spin probe molecules causes a shift of the outer lines towards the center, which appears to the EPR device as a decrease in the hyperfine coupling constant. The shift in spin exchange frequency is proportional to the molar ratio of spin probe to micellized surfactant, and so, determining that frequency gives the desired molar quantity of micelles. Various spin probes, such as nitroxide spin probes can be found in Windle, J. J., "Hyperfine coupling constants for nitroxide spin probes in water and carbon tetracholoride," J. Magnetic Resonance, Vol 45, Issue 3, 1981, pp. 432-439; Bordignon, E., "EPR Spectroscopy of Nitroxide Spin Probes," doi.org/10.1002/9780470034590.emrstm1513 eMagRes, 2017, pp. 235-254; and Griffith, O. H. and Waggoner, A. S., "Nitroxide Free Radicals: Spin Labels for Probing Biomolecular Structure," Acc. Chem. Res., 1969, 2 (1), pp 17-24, all of which are herein incorporated by reference in their entireties.

The line width and line shapes of EPR spin probes in aqueous surfactant solutions can be determined by several factors including the effective rotational correlation time of the spin probe, unresolved proton hyperfine splittings, intermolecular spin-spin interactions, and the rotational correlation time of the aggregate. See Molin, Y. N., Salikhov K. M., Zamaraev, K. I., Spin exchange principles and applications in Chemistry and Biology; Springer-Verlag: New York, 1980; Vol. 8, which is herein incorporated by reference in its entirety. In the context of a nitroxide spin probe surrounded by an aqueous surfactant, one parameter includes the average volume fraction occupied by micelles in the vicinity of the nitroxide moiety on the spin probe.

The aggregation number is a description of the number of molecules present in a micelle once the critical micelle concentration (CMC) has been reached. Nitroxide spin probes have characteristic features that allow derivation of that aggregate information. Example spin probes 5DSE and 16DSE both exhibit an EPR spectrum with three distinct lines similar to that of FIG. 2B. As noted above, the aggregation number can change the spacing between those lines.

These and other spin probes can be used with common oilfield corrosion inhibitors, whether anionic or cationic (or nonionic or zwitterionic). Non-limiting examples of inhibitors include sodium dodecyl sulfate (SDS) and quaternary imidazoline, both of which can form micelles if present in concentrations above a certain threshold.

In some embodiments, the methods described herein may include selecting a reagent, such as a spin probe, that has a readily measurable hyperfine splitting and/or an electrochemical structure that changes in the presence of nearby micelles. As non-limiting examples, 5DSE and 16DSE both have these properties.

Nitroxide spin probes have characteristic features that allow derivation of at least the aggregation count, not just of the presence of micelles. In aqueous solutions, the aggregation numbers for surfactants generally range between 10 and 100. A significant meaning of the aggregation number from a corrosion perspective comes from the fact that its value is inversely proportional to the minimum surface area per molecule. Surface polarity decreases with an increase in the aggregation number. Thus, in at least one embodiment, the methods described herein may be used to determine, at least, the presence of micelles, the aggregation count, the molar amount of micelles, or a combination thereof.

Another known use of spin probes is to trap an excitation. For example, consider that radiation with gamma, X-ray, etc. displaces an electron to an outer-orbital but such that this excitation decays very rapidly when the radiation stops, in which case the electron will fall back to its original orbit (indeed, this is precisely the mechanism behind XRF detection). A spin probe, however, could be designed to trap the excited electron so that the EPR signature persists after the radiation has ceased. A common method for spin-trapping involves the addition of radical to a nitrone spin trap resulting in the formation of a spin adduct, a nitroxide-based persistent radical, that can be detected using EPR. The spin adduct usually yields a distinctive EPR spectrum characteristic of a particular free radical that is trapped. The identity of the radical can be inferred based on the EPR spectral profile of their respective spin adducts such as the g value, but most importantly, the hyperfine-coupling constants of relevant nuclei. Unambiguous assignments of the identity of the trapped radical can often be made by using stable isotope substitution of the radicals parent compound, so that further hyperfine couplings are introduced or altered.

Example EPR Systems

Figure 3:
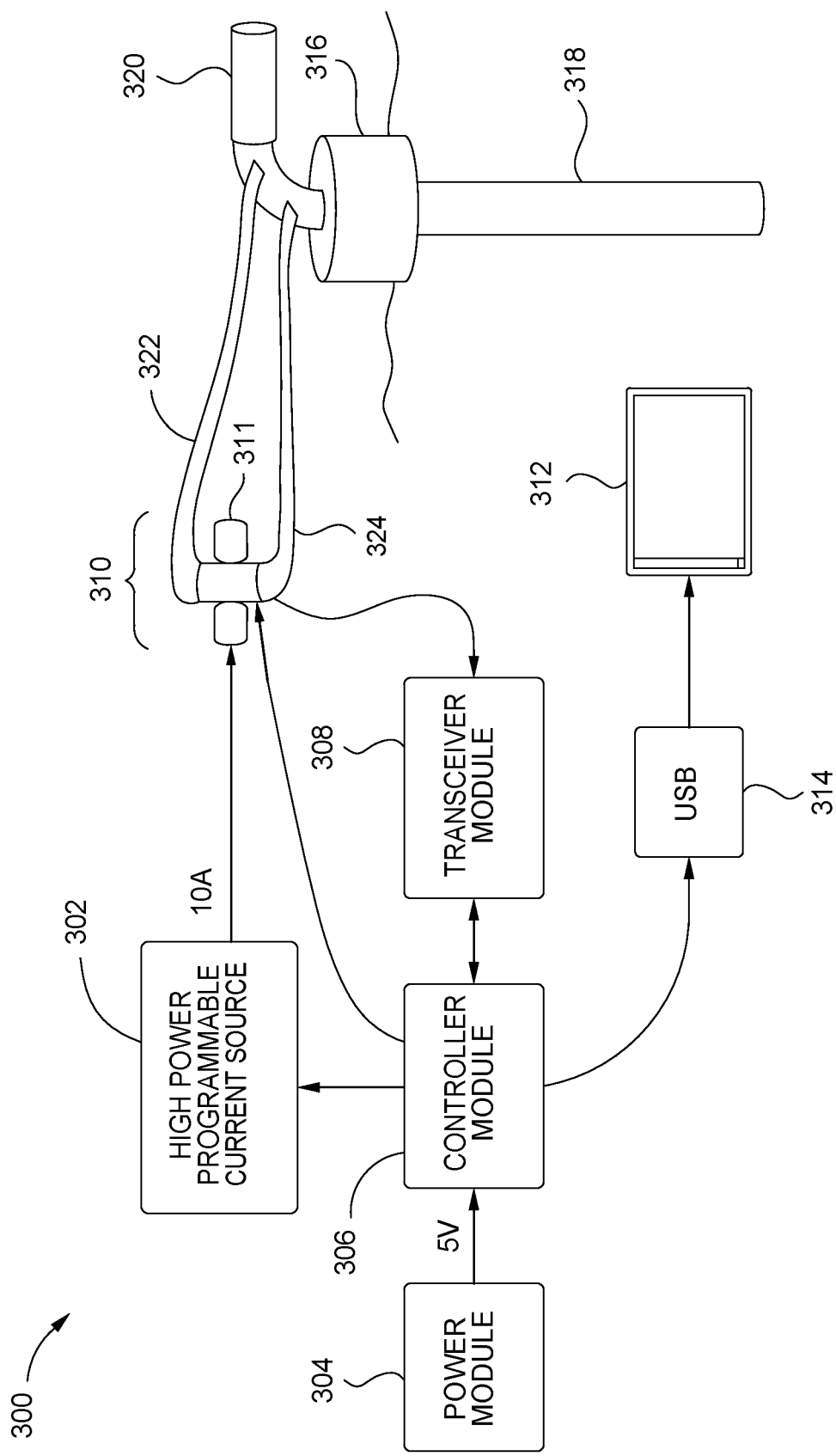
FIG. 3 is a block diagram of an example EPR system, in accordance with at least one embodiment of the present disclosure.

FIG. 3 is a block diagram of an example EPR system 300, in accordance with at least one embodiment of the present disclosure. As shown, the EPR system 300 can include five modules: a high power programmable current source 302, a power module 304, a controller module 306, a transceiver module 308, and a resonator assembly 310. The high power programmable current source 302 may be implemented by a power supply with, for example, a gain of 5 A/V capable of 10 A with a 100 MHz load. For certain embodiments, an appropriate level of accuracy is 0.1% (±0.01 A). The output of this programmable current source 302 feeds a magnet 311 in the resonator assembly 310 to control the magnetic field. The controller module 306 may be capable of outputting a control voltage (e.g., ranging from 0 V to 2 V) to control the programmable current source 302. The power module 304 may be a system capable of transforming mains electricity (e.g., 120 VAC at 60 Hz) to one or more DC voltages (e.g., 12 VDC, 5 VDC, and/or 5.5 VDC) for use in the EPR system 300. The transceiver module 308 may be an EPR frequency board, capable of generating an RF signal for a resonator in the resonator assembly 310. Two board options may be considered for the transceiver module: an integrated circuit (IC) transceiver board and a discrete component transceiver board. For example, the discrete component transceiver board may use a 12 VDC power supply voltage output by the power module 304. Alternatively, the IC transceiver board may use a 5 VDC power supply voltage, which may be buffered through the controller module 306.

The EPR system 300 may also include a human-machine interface (HMI) 312, such as a computer or any of various other devices (e.g., a tablet, a smartphone, and the like) with a suitable processing system, a display, and means for inputting instructions (e.g., a keyboard, mouse, stylus, touchscreen, and the like). The HMI 312 is capable of sending commands to and receiving data from the controller module 306 (e.g., via a USB/UART bridge 314 or via wireless communications, such as WiFi according to IEEE 802.11).

As shown in FIG. 3, the EPR system 300 may remain in continuous fluid communication with equipment at a wellsite, such as a wellhead 316 disposed at the surface and/or production tubing 318 disposed in a wellbore. The production tubing 318 may be one of multiple tubulars in the wellbore. It is not uncommon, for example, that the production tubing 318 is contained within a number of strings of casing (not shown). The wellhead 316 as drawn figuratively represents the connection between a surface production pipeline 320 and the production tubing 318. As is well known in the industry, wellheads typically have a number of sample ports thereon, which allows an operator access to the fluid flowing from a reservoir. During production, the flow path from the production tubing 318 through the wellhead 316 to the pipeline 320 is generally maintained as a pressure barrier to prevent reservoir fluids from polluting the air and ground nearby. Consequentially, the fluid communication channels 322, 324 from the wellhead 316 to the resonator assembly 310 and back should be able to withstand internal fluid pressure. The connections of the channels 322, 324 to the wellhead 316 may be permanently welded or may be hose connections that are certified for exposure to oilfield fluids and pressures.

As depicted, the fluid connection for the channels 322, 324 is made downstream of the wellhead 316 and upstream of the surface pipeline 320, but other configurations may be utilized, which will be clear to those skilled in the art. For example, the connections may be located further downstream, such as in the vicinity of a pipeline manifold or at sample points along a pipeline as the pipeline transfers fluid from the wellbore to a refinery or vessel. Alternatively, the connections may be below the wellhead 316, such as in a scenario where the resonator assembly 310 is incorporated as an in-well sensor.

Example Processes

Figure 4:
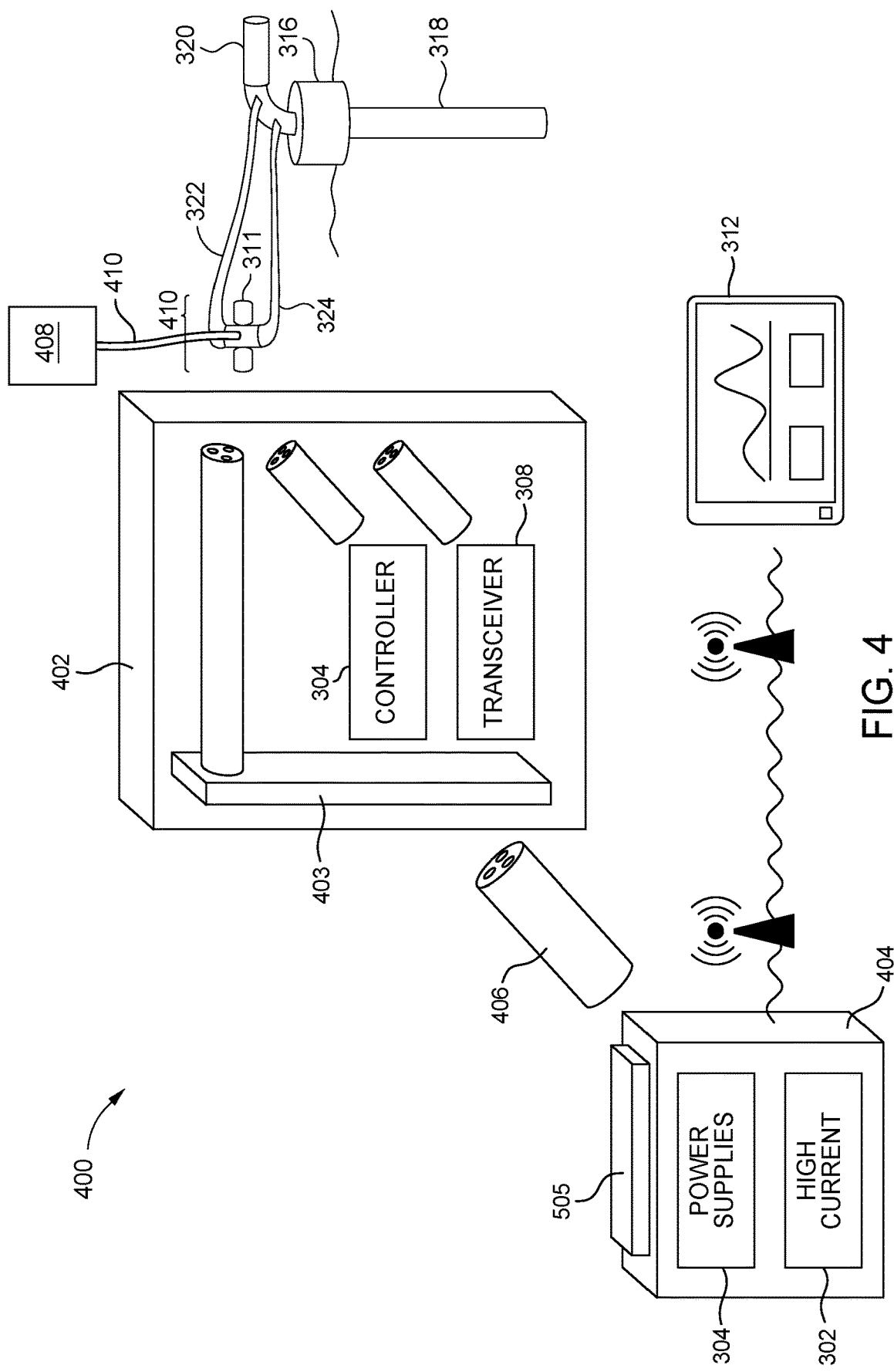
FIG. 4 is a block diagram of an example EPR system fluidically connected to a wellbore for making measurements of a fluid therein, in accordance with at least one embodiment of the present disclosure.

In at least one embodiment, reagents can be added with spin probes which are indicative of micelle concentration. The spin probes can be detected by EPR. Examples of spin probes are given in publications such as Berliner, L. J., "Spin labelling I: theory and applications" (1976) and Berliner, L. J., "Spin labelling II: theory and applications" (1979), both by Academic Press, New York, which are herein incorporated by reference in their entireties. An example wellsite configuration where reagents may be added is illustrated in FIG. 4. In at least one embodiment, an oilfield sensor may be created by incorporating an electron paramagnetic resonance (EPR) sensor along with a system to add reagents to the fluid under test. By using specially configured reagents, such as spin probes, the sensor will measure not the transition metal ions, but instead the presence of the inhibitors in the water phase, specifically by creating a change in paramagnetic signature that will be caused by the presence of inhibitor micelles. Taking measurements on an episodic basis and/or continuous basis allows the introduction of reagents to the flow assurance workflow.

As illustrated in FIG. 4, the HMI 312 may be some significant distance away from the wellhead 316. In this case, the HMI 312 may be in communication with a portion of the wellsite equipment by means of the Cloud and/or other communications network (e.g., WiFi according to the IEEE 802.11 standard). Indeed, in a typical oilfield setting, some components may be positioned close to the wellbore, while others may be located relatively far away. RF components, such as the resonator assembly 310 and the transceiver module 308, should be typically spaced within a few feet of each other. To keep the channels 322, 324 short, the resonator assembly 310 may most likely also be positioned within a few feet of the wellhead 316. This means that these RF components may most likely be enclosed in one or more explosion-proof housings 402 to avoid any safety issues, should there be accidental release of hydrocarbon at the wellhead 316. The power supplies (e.g., the high power programmable current source 302 and the power module 304), audio-frequency devices, etc. can be some distance removed from the wellhead without issue, so these components need not be in explosion-proof housing(s), but might benefit from being in housings 404 to provide insulation from the rain, snow, heat, etc. The proximate components (e.g., in the housing(s) 402) may include one or more junction boxes 403. Similarly, the remote components (e.g., in the housing(s) 404) may include one or more junction boxes 405 for coupling to the junction boxes 403 via a cable 406. For certain embodiments, the cable 406 may be a multicore armored cable.

A reagent, such as a spin probe or a composition containing a spin probe, can be stored in a container 308 and be introduced via line 410 to channels 322, 324. The line 410 may include a pump and/or a valve (not shown), either of which may be metered. Such pumps and/or valves may enable adjustment of the amount of reagent added. By using specially configured reagents and/or spin probes, one can measure the presence of the inhibitors in a fluid (e.g., the water phase and/or oil phase), specifically by creating a change in paramagnetic signature that will be caused by the presence of inhibitor micelles.

Figure 5:
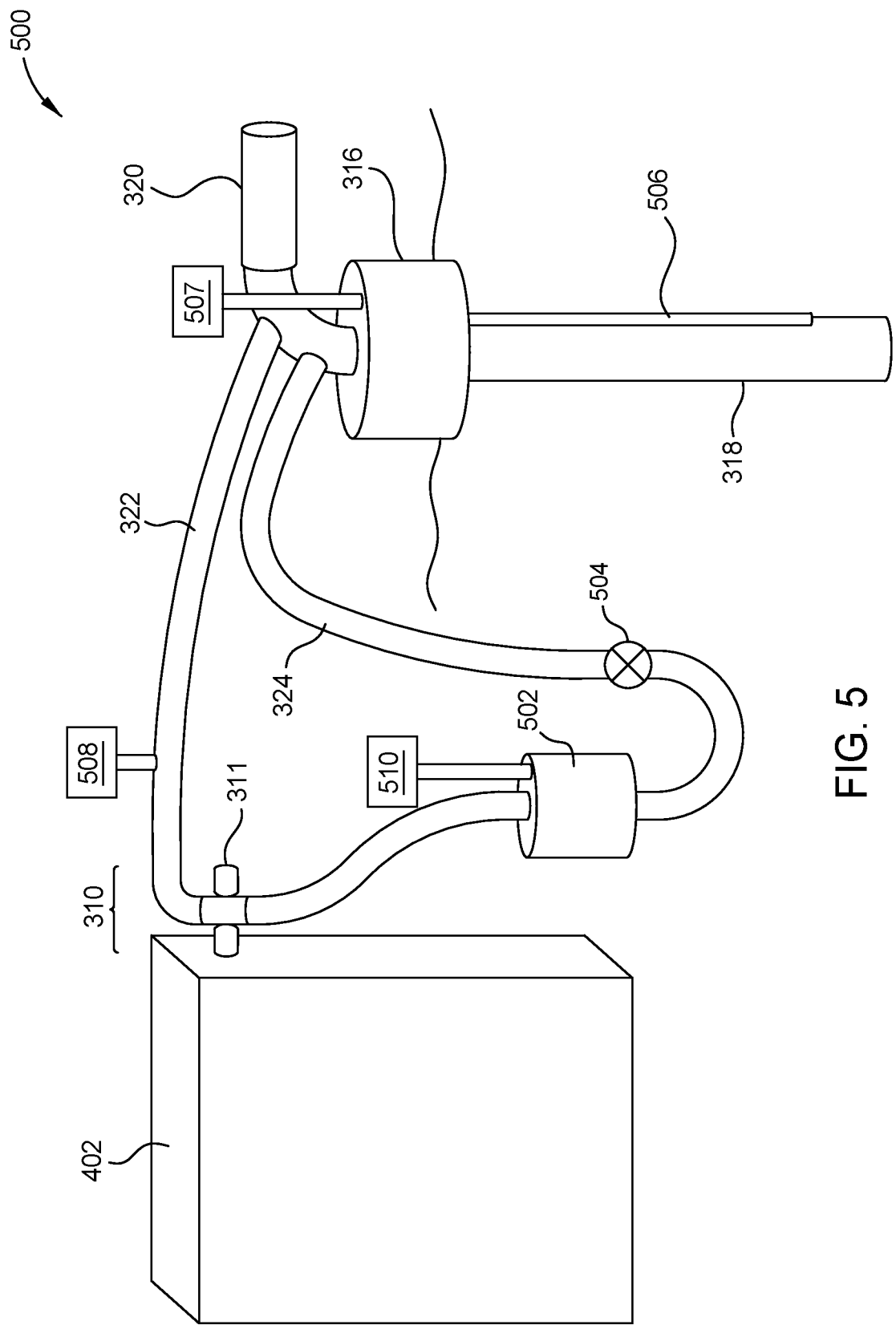
FIG. 5 is a block diagram of an example EPR system with a separator and a pump to increase the sensitivity of an EPR spectrometer to a particular component of the fluid, in accordance with at least one embodiment of the present disclosure.

FIG. 5 is a block diagram of an example EPR system 500 with a separator 502 and a pump 504 to increase the sensitivity of an EPR spectrometer to a particular component of a multiphase fluid (e.g., oil and water phases) from a wellbore, in accordance with at least one embodiment of the present disclosure. The separator 502 may be used to partially separate multiple phases from the multiphase fluid received from the wellhead 316 via the fluid communication channel 324. For example, the opening and closing of one or more valves in or associated with the separator 502 may be controlled to temporarily store the multiphase fluid in the separator, allow time for the separator to separate at least a portion of one phase from one or more other phases in the multiphase fluid, and/or permit the resulting fluid to enter the resonator assembly 310 for performing EPR spectroscopy. For example, the separator 502 may receive a multiphase fluid that is 98% water and 2% oil and generate a fluid that is 20% oil and 80% water. In this manner, the multiphase fluid reaching the resonator cavity has a higher percentage of oil, such that the paramagnetic species of interest in the oil will have a higher concentration, thereby resulting in an EPR spectrometer with increased sensitivity for the species of interest. Additionally or alternatively, the separator 502 may receive a multiphase fluid that is 98% oil and 2% water and generate a fluid that is 20% water and 80% oil. In this manner, the multiphase fluid reaching the resonator cavity has a higher percentage of water, such that the paramagnetic species of interest in the water will have a higher concentration, thereby resulting in an EPR spectrometer with increased sensitivity for the species of interest.

In at least one embodiment, the separated portion of the one phase may be removed from the separator 502 by the optional fluid access 510. The pump 504 may be used to pump the multiphase fluid from the wellhead 316 into the separator 502 via the fluid communication channel 324. The pressure, temperature, and/or other properties of the resulting fluid in the fluid communication channel 322 may be measured by one or more gauges 508.

In some embodiments, an injection line 506 may be disposed in the wellbore (e.g., a production well), which may run adjacent to the production tubing 318. For other embodiments, the injection line 506 may be disposed in a different wellbore (e.g., an injection well). A fluid (e.g., a gas, such as carbon dioxide ($CO_2$), or an inhibitor) may be injected into the injection line 506 via an injection valve 507, which may be located at the wellhead 516.

In some embodiments, the separator 502 may operate based on gravity and the natural separation of an unstable emulsion (e.g., of oil and water) or other colloid that occurs over time. In at least one embodiment, the separator 502 may break the emulsion through the addition of a chemical component. In this case, the chemical component may be added, for example, via the injection valve 507 or another port at the wellhead 316. In the case of a multiphase fluid (e.g., a colloid) with a gas phase, the gas may be vented out (e.g., via the fluid access 503 or another port) before the remaining fluid is allowed to proceed to the resonator assembly 310 (e.g., by controlling the valves in the separator).

For application to, at least, corrosion products and scaling, the device can be plumbed to the water outlet of the separator not the oil as the chemical species pertinent to corrosion and scaling are transported by the water.

In at least one embodiment, the water can be separated from the oil, e.g., in the case of horizontal well and vertical well. This separation can be used for, e.g., detection of species such as micelles, scaling, and solid deposits. It can also be useful when deploying the systems, tools, and methods described herein to the field. The device tolerates relatively low water cut (it may be more than zero) but can lose resolution as the water cut increases. The field device has a mechanical separator which can keep the watercut below 5-10%.

The sensing apparatus and separator (and a small pump) may be on one side of the metal housing, whereas the sensitive electronic transceiver may be on the other side. This setup helps keep electromagnetic interference away from the resonator.

In some embodiments, the EPR spectrometer may be plumbed into a side-stream at the wellhead. Fluid may exit the wellhead to the EPR spectrometer while remaining at elevated temperature and pressure, and without exposure to oxygen. This may ensure that the chemical composition of the fluid in the spectrometer is an accurate representation of the chemistry of the fluid passing through the wellhead. As a general statement, EPR measurements in aqueous environments can be challenging, because the water conductivity (typically 1-3 S/m) can drastically lower the quality factor (Q) of the EPR resonator, which in turn cuts the signal.

EPR sensors, as disclosed in US 2018/0224414 and US 2019/0302306, both to Kulbrandstad et al., may be used. Such EPR sensors allow for real-time EPR analysis of molecules, ions, etc. during flow through the wellhead. The output from the resonator may be transmitted to the Cloud and monitored in real-time. This may allow operators to better manage a mitigation program. A specific EPR apparatus that can be used in one or more embodiments may be one designed for field use, as described in US 2018/0224414 and US 2019/0302306.

For example, the EPR sensor may derive permittivity, conductivity, density, viscosity, pressure, pH, and/or temperature. In the case of permittivity, the EPR sensor may derive a spectrum of complex permittivity values over a frequency range. Thus, and in some embodiments, one or more additional sensors (such as temperature, conductivity, dissolved solids, and/or pH) may also be added in order to derive a unique solution for micelle presence.

In at least one embodiment, an EPR spectrometer is used to measure the quantity of corrosion-related chemical species. Such measurements may be performed real-time, episodically, or a combination thereof. The real-time data analysis may include tracking percentages of certain transition metal ions dissolved in produced water. An example episodic measurement may measure the presence of inhibitor micelles and give an indication of the sufficiency of the chemical inhibition. For example, if the amount of inhibitor at the surface is above the critical micelle concentration (CMC), then one could infer that enough inhibitor had been injected.

Figure 6A:
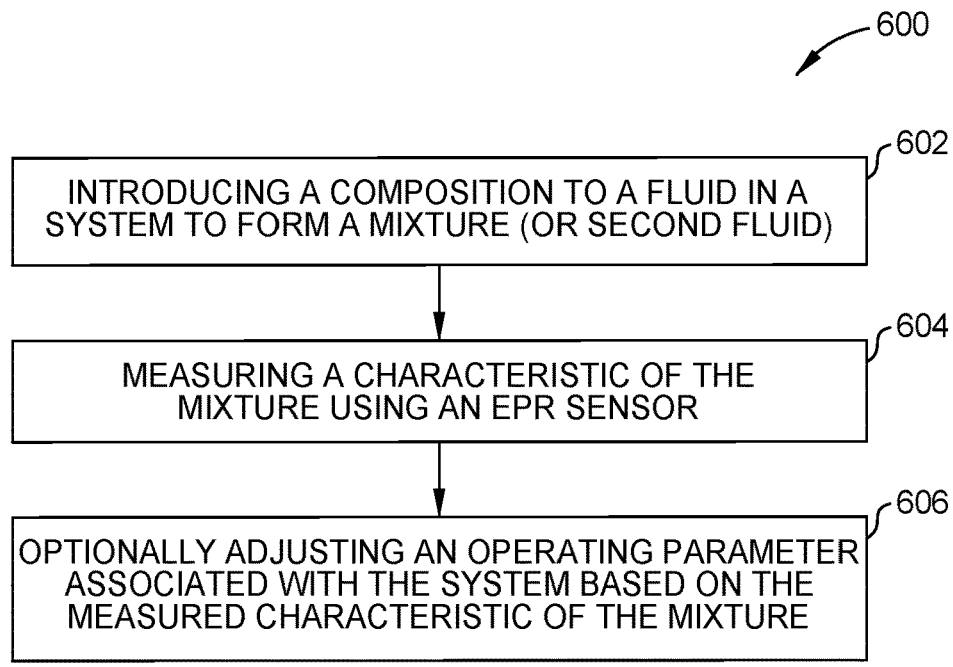
FIG. 6A is a flow diagram of an example method for controlling a system based on EPR sensing, in accordance with at least one embodiment of the present disclosure.

FIG. 6A is a flow diagram of an example method 600 for controlling a system based on EPR sensing, in accordance with certain embodiments of the present disclosure. The method 600 may be applicable to, at least, solid deposition, scale monitoring, polymer injection, hydrate monitoring, and/or corrosion. Paramagnetic sensing downstream of interaction may be used to guide upstream injection.

The method 600 may include introducing a composition (which may be in liquid form) having paramagnetic properties into a tubular at operation 602. This composition may have paramagnetic properties itself and/or may be an inhibitor or other material without paramagnetic properties. In some embodiments, a reagent such as a spin probe may be added to provide paramagnetic information. The spin probe could be chemically attached to the inhibitor before it is deployed in the wellbore, or the spin probe could be added to the returned fluid at the surface. In the latter case, the spin probe may chemically attach itself to the inhibitor or, in at least one embodiment, the spin probe remains chemically distinct from the inhibitor molecule but the EPR spectrum from the spin probe changes depending on any polar effects caused by aggregation and micellization of inhibitor molecules near that probe. An example of such a paramagnetic change is demonstrated by the hyperfine structure exhibited in FIG. 2B.

The composition may mix, or may be caused to mix, with a fluid in the tubular to form a mixture (or second fluid). Here, the composition may interact with, e.g., the tubular housing (corrosion), with water in the tubular (scale), and/or with the reservoir as in polymer enhanced oil recovery. The method 600 may further include measuring a characteristic of the mixture using an EPR sensor at operation 604. The method 600 may further include an optional operation 606 of adjusting an operating parameter associated with the system based on the measured characteristic of the mixture.

Any of various species in the fluid may be measured by the EPR sensor. For example, the species being sensed may include free radical and transition metal ions, such as asphaltene (free radicals), scales, spin probes, inhibitors, and/or ions, that have an EPR signature. The EPR sensor may provide a spectroscopic view of the paramagnetic components of the sample, but may also have additional sensors thereon. For example, the combined sensing apparatus may derive permittivity, conductivity, density, viscosity, pressure, pH, and/or temperature. In the case of permittivity, the EPR sensor may derive a spectrum of complex permittivity values over a frequency range.

The EPR sensor may be disposed at any of various suitable locations (e.g., to implement the operations described herein). For example, the EPR sensor may be located downhole, at a wellhead producer (i.e., the wellhead of a production well), at a wellhead injector (i.e., the wellhead of an injection well), at a header or gathering facility, at a test separator or facility, at a storage, at an input to a refinery, or in the refinery process. In this manner, the species of interest may be continuously monitored throughout a field or a process, at one or more locations as desired. Furthermore, the system can be adjusted in real-time based on the characteristics of the species measured with the EPR sensor(s). As an example, paramagnetic sensing downstream of an interaction may be used to guide upstream injection.

For example, the EPR sensor may be positioned at a wellhead (e.g., of an injection well or a production well) to measure micelle concentration. Chemicals (e.g., inhibitors such as inhibitors having paramagnetic properties, and/or reagents such as spin probes having paramagnetic properties) may be injected into the well. The EPR sensor allows for measurements of the resulting fluid, so the amount of inhibitors being injected may be adjusted accordingly. For example, if an insufficient amount of a particular inhibitor is being injected, the EPR sensor may measure a decrease in CMC in real time, and the inhibitor injection may be increased based on these measurements. Alternatively, if excessive chemicals are being injected, the operator and/or the EPR system may decrease those chemicals, for example, until the CMC is sensed, which may thereby identify an optimal amount of inhibitor. With this closed-loop control, an optimal amount of chemicals may be injected, which should save money by not using excessive chemicals. In other words, certain embodiments of the present disclosure provide an online monitoring EPR sensor (e.g., at the wellhead) that generates a signal to optimize, or at least adjust, chemical injection.

In some embodiments, a portable EPR device may be fluidically connected to a wellhead, oilfield tubular, or downhole device and may detect the presence and concentration of inhibitor without human intervention to take a sample. The feedback from the portable EPR device may be used in an automatic control system for use with automated injection of inhibitor composition (e.g., to maintain concentrations at or above critical micelle accumulation).

Figure 6B:
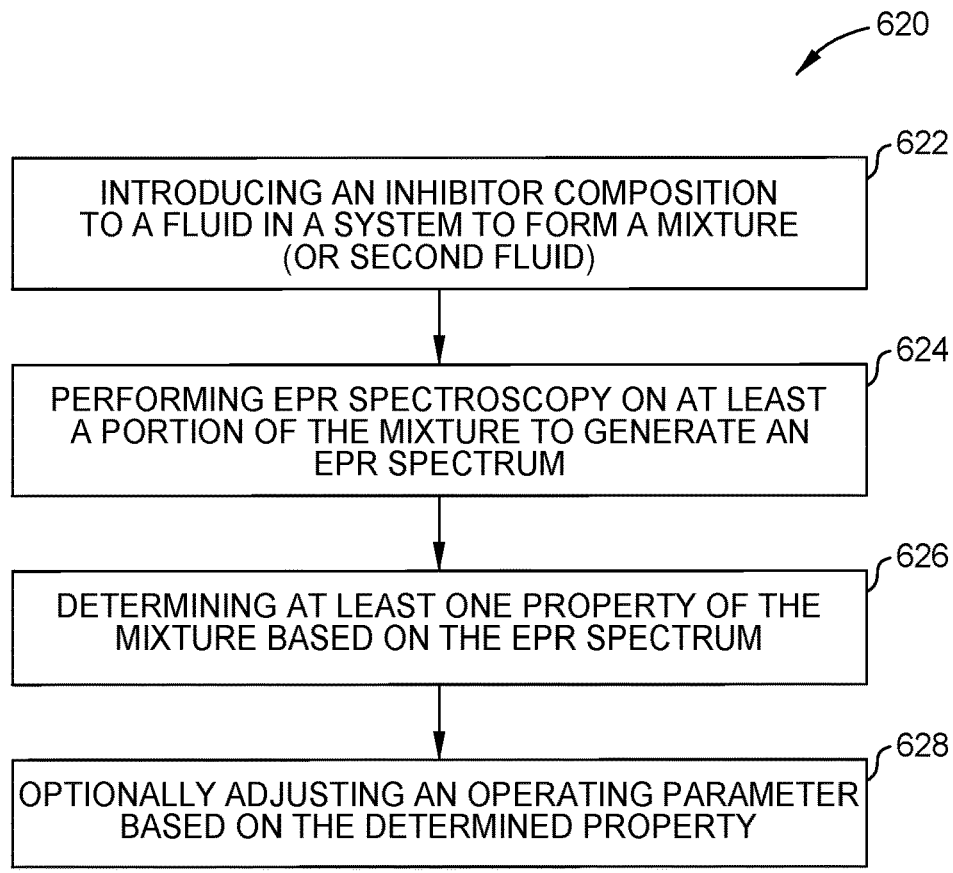
FIG. 6B is a flow diagram of an example method for determining a property of a fluid, in accordance with at least one embodiment of the present disclosure.

FIG. 6B is a flow diagram of an example method 620 for determining a property of a fluid (e.g., a wellbore fluid), in accordance with at least one embodiment of the present disclosure. The method 620 can be applicable to, at least, solid deposition, scale monitoring, polymer injection, hydrate monitoring, and corrosion. The method 620 may include introducing an inhibitor composition having paramagnetic properties into a tubular at operation 622. The composition may mix, or may be caused to mix, with a fluid in the tubular to form a mixture (or second fluid). Here, the composition may interact with, e.g., the tubular housing (corrosion), with water in the tubular (scale), and/or with the reservoir as in polymer-enhanced oil recovery. The method 620 may further include performing EPR spectroscopy (e.g., using an EPR spectrometer) on at least a portion of the mixture to generate an EPR spectrum at operation 624. The method 620 may further include determining at least one property of the mixture based on the EPR spectrum at operation 626. For some embodiments, the method 620 may further include adjusting an operating parameter (e.g., of a hydrocarbon recovery operation) based on the determined property at optional operation 628.

Figure 6C:
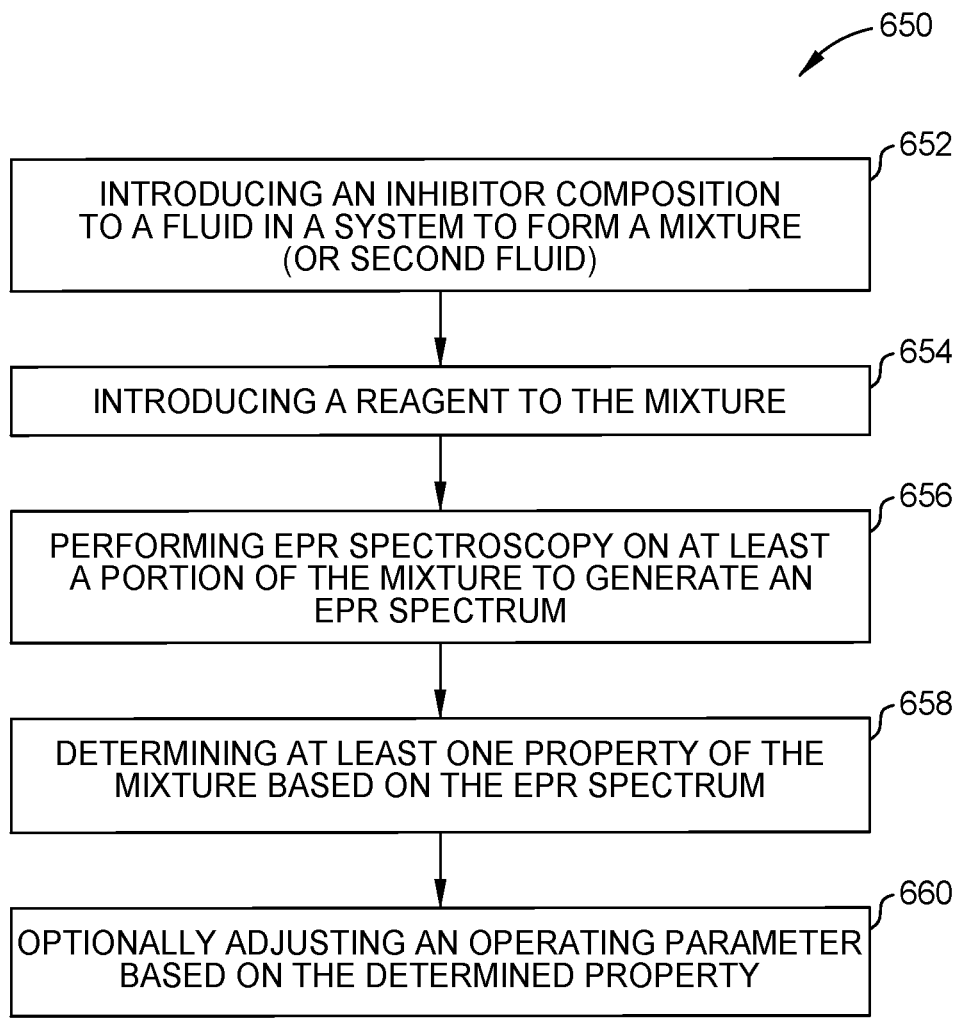
FIG. 6C is a flow diagram of an example method for determining a property of a fluid, in accordance with at least one embodiment of the present disclosure.

More commonly, however, the injected inhibitor composition will not itself be paramagnetic, in which case a reagent, such as a spin probe, may be added which provides paramagnetic information. The spin probe may be designed to chemically bond with the wellbore fluid and to be pumped into the well along with the inhibitor or it may be added to the produced fluid as it is being produced. In the latter case, the spin probe may be designed to bond with the inhibitor composition or may be chosen to have a paramagnetic attribute which changes in the presence of nearby changes in polarity, aggregation or micellization such as shown in FIG. 2B. FIG. 6C is a flow diagram of an example method 650 for determining a property of a fluid, e.g., a wellbore fluid, in accordance with at least one embodiment of the present disclosure. The method 650 can be applicable to, at least, solid deposition, scale monitoring, polymer injection, hydrate monitoring, and corrosion. The method 650 may include introducing an inhibitor composition, which does not itself have paramagnetic properties, into a tubular at operation 652. The composition may mix, or may be caused to mix, with a fluid in the tubular to form a mixture (or second fluid). Here, the composition may interact with, e.g., the tubular housing (corrosion), with water in the tubular (scale), and/or with the reservoir as in polymer-enhanced oil recovery. The method 650 may further include introducing a reagent to the mixture at operation 654, the reagent having paramagnetic properties. The method 650 may further include performing EPR spectroscopy (e.g., using an EPR spectrometer) on at least a portion of the mixture to generate an EPR spectrum at operation 656. The method 650 may further include determining at least one property of the mixture based on the EPR spectrum at operation 658. The method 650 may further include an optional operation 660 of adjusting an operating parameter (e.g., of a hydrocarbon recovery operation) based on the determined property.

In some embodiments, the methods described herein may include monitoring (periodically and/or continuously) a fluid using an EPR device and periodically (e.g., once a month) making an additional measurement. This additional measurement may be achieved by adding a predetermined quantity of reagent, such as a spin probe, to the fluid, performing EPR spectroscopy, and determining a property of the fluid. In this way, the EPR can change the signature in the spectrum from that of a reference spectrum, and from that measurement derive the presence of micelles.

Example Spin Induction

Nanoparticles may be developed that incorporate paramagnetic ions therein, so the use of those particles with surface paramagnetic monitoring is also part of some embodiments of the present disclosure. For example, such particles have been disclosed by C. Yan, R. Tomson, P. Guraieb and N. Ghorbani in "Nanoparticle carrier platform and methods for controlled release of subterranean well treatment additives," U.S. Pat. No. 9,926,485, the entire contents of which are hereby incorporated by reference. Paramagnetic readings of such particles may measure anisotropy of relaxation, giving an indication whether the particles had formed into micelles. When in solution, the rotational and translational motion of molecules often averages out the anisotropic interactions. Due to short relaxation times, pulse EPR measurements can be performed at low temperatures where molecular motion is frozen. These "frozen solutions" EPR spectra are qualitatively identical to powder spectra and may be used to measure anisotropic response. Alternatively, nanomaterials may be designed which align themselves with preferred orientation in flow, which would allow measurement of anisotropy in flowing fluid. Electrostatic fields may also be used to orient the molecules. As noted above, the use of a spin-trap can capture of the fleeting resonance.

For measurement and quantification of species that are not themselves paramagnetic, a sensor that includes a spin inducer and an EPR spectrometer may be used. Species that do not have paramagnetic signatures themselves may include wax, paraffin, asphaltene, scale, hydrates, and ions. Abundant scale-forming ions may include $Ca^{2+}$, $Mg^{2+}$, $Ba^{2+}$, $Sr^{2+}$, $Na^+$, $K^+$, $CO_3^{2-}$, $SO_4^{2-}$, and $Cl^-$, among others.

In at least one embodiment, the spin inducer may be a section of the flow in which the fluid may be subjected to radiation by gamma rays, neutrons, x-rays, THz radiation, ultra-violet radiation, plasma-beam, etc., from a radiation source. The fluid may include molecules, having electrons that can be excited by such radiation, and the excited electrons may be resonated by the EPR spectrometer, which thereby may be used to create an EPR spectrum. Analysis of that spectrum may then enable quantification of a total amount (e.g., in concentration) of that chemical species such as wax, paraffin, asphaltene, scale, hydrates, and ions (e.g., $Ca^{2+}$, $Mg^{2+}$, $Ba^{2+}$, $Sr^{2+}$, $Na^{2+}$, $K^+$, $CO_3^{2-}$, $SO_4^{2-}$, and $Cl^-$, among others). The radiation may be responsible for changing the orbital spin structure in a manner similar to that seen with x-ray fluorescence (XRF). However, rather than wait for an excited electron to fluoresce as the electron falls back to its low-energy orbital, the excited electron is directly resonated by the EPR spectrometer. In effect, the spin inducer converts a diamagnetic component into one which is paramagnetic and which thereby can be used to create an EPR spectrum.

Some embodiments may include incorporating the spin inducer and EPR resonating species into the same cavity. In at least one embodiment, the ionizing radiation may be applied at the same time as the EPR measurement is being taken. In some embodiments, the ionizing radiation may be applied upstream of the EPR resonating species. In this case the fluid may be ionized in one section of the EPR device, and the EPR measurement may be made quickly thereafter before the radiation-induced spins have decayed. It is noted that thermal effects can generally accelerate the resumption back to diamagnetism. In some embodiments, a chilling system may be utilized to, at least, mitigate these thermal effects.

As an example, and in some embodiments, gamma rays may be provided by Cobalt-60 as is common in food irradiation or may be generated from a device such as a minitron as described in, for example, U.S. Pat. No. 5,804,820 to Evans et al., entitled "Method for Determining Density of an Earth Formation" and issued Sep. 8, 1998, which is herein incorporated by reference in its entirety.

Figure 7A:
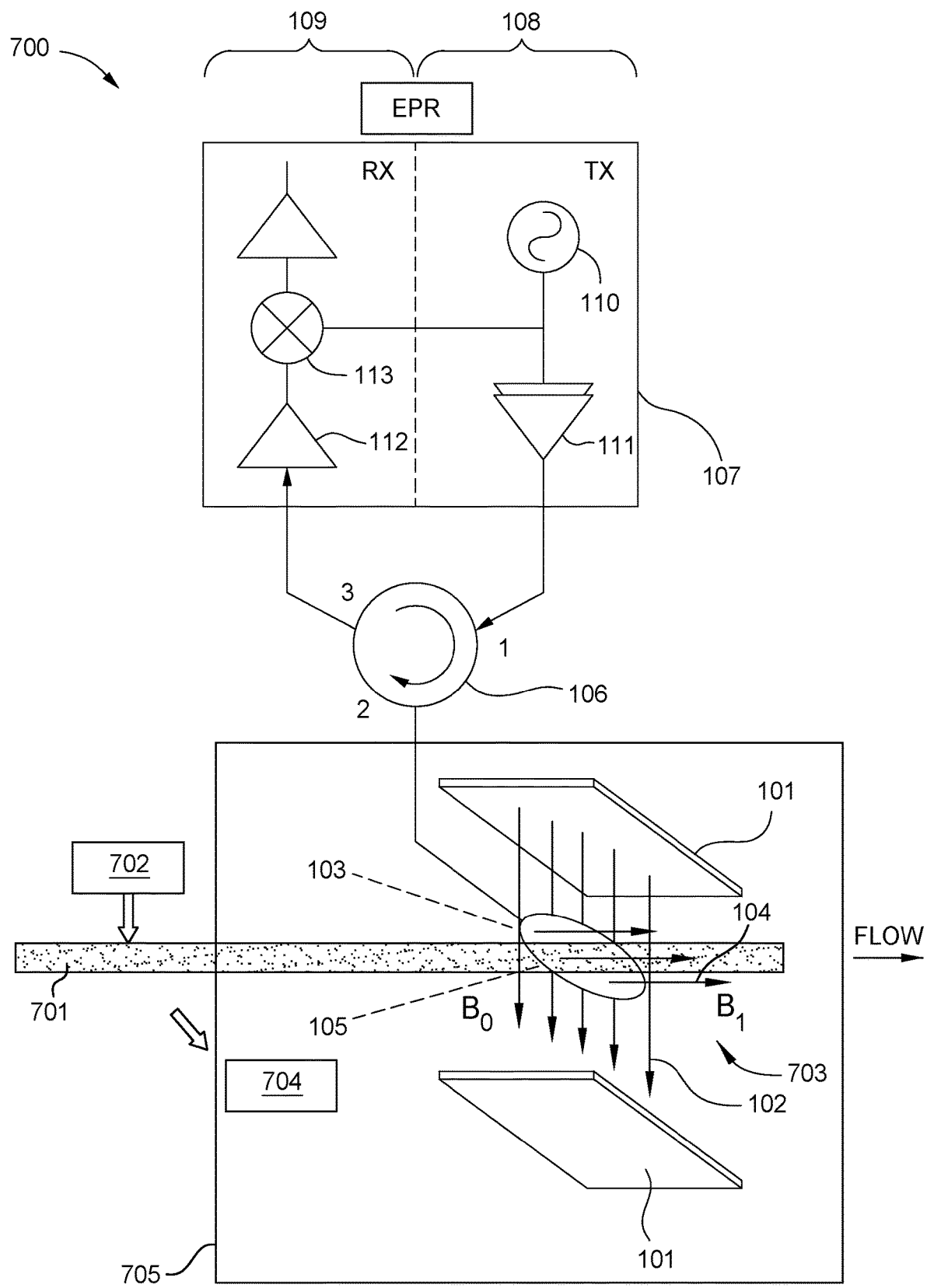
FIG. 7A is a block diagram of an example device that includes a spin inducer and EPR spectrometer, in accordance with at least one embodiment of the present disclosure.

FIG. 7A is a block diagram of an example device 700 that includes a spin inducer and EPR spectrometer, in accordance with at least one embodiment of the present disclosure. Fluid flowing through a conduit 701 passing through a spin inducer 702 may be irradiated with a radiation source, such as a high-energy radiation source (e.g., gamma rays, neutrons, x-rays, ultra-violet radiation, THz radiation, plasma-beam, etc.), so as to convert a diamagnetic species in the fluid into a species that is paramagnetic. The device 700 includes an EPR spectrometer 703 that transmits electromagnetic field into a pressure containing region 705 through which the fluid passes. An embodiment of the EPR spectrometer that may be used is described above in relation to FIG. 1A. The device 700 has resonator cavity 103 and a sample chamber 105 therein and the sample chamber 105 may contain the pressure of the fluid. In an alternate configuration, the entirety of the resonator cavity 103 may itself be pressure bearing. The fluid in the sample chamber 105 may be subjected to a high-amplitude, low-frequency magnetic field and an RF electromagnetic wave wherein either or both the high-frequency or low-frequency components may be swept so as to create an EPR or related (electron nuclear double resonance (ENDOR), etc.) spectrum. Optionally, a radiation source receiver 704, e.g., an X-ray receiver, may be a component of the device 700. The radiation source and receiver or other spin inducer may be a separate assembly upstream of the inflow to the resonator cavity 103 as exemplified in FIG. 7A or it can be integrated within the resonator cavity 103. In the case that the radiation is upstream, albeit short-lived, then reagents for spin-trapping can be added upstream of that radiation.

The spectrum may be analyzed and may enable quantification of an amount of chemical species, such as wax, paraffin, asphaltene, scale, hydrates, and ions, among others. Examples of ions include $Ca^{2+}$, $Mg^{2+}$, $Ba^{2+}$, $Sr^{2+}$, $Na^+$, $K^+$, $CO_3^{2-}$, $SO_4^{2-}$, and $Cl^-$, among others. Such analysis and quantification may be performed with, e.g., a nearby apparatus or via edge computing on the Cloud, which is described above. The fluid flows through a section of a tubular and/or other oilfield equipment through which oil-related fluids can flow, whether that is downhole or at the surface, near a wellhead, at a refinery, or anywhere in between. The flow may be diverted via a side-stream or may be the main tubular flow. The flow may be temporarily stopped to make the measurement, or the measurement may be made "on-the-fly" as the flow passes through the device.

Figure 7B:
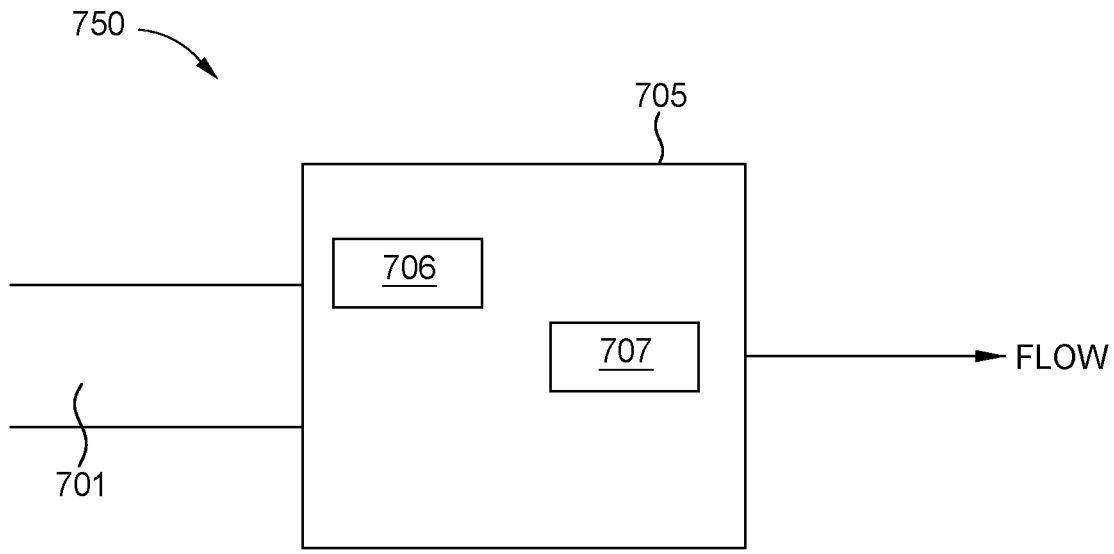
FIG. 7B is a block diagram of an example pressurized housing, in accordance with at least one embodiment of the present disclosure.

FIG. 7B is a block diagram 750 of an example pressurized housing 705 which may be used with device 700 in accordance with at least one embodiment of the present disclosure. A first window 706 may be disposed in the pressurized housing 705 that is transparent to the radiation energy coming from the radiation source of the spin inducer 702. A second window may be disposed in the pressurized housing 705 that is electrically transparent to the RF fields coming from the EPR 703. In at least one embodiment, the first window 705 and the second window 706 are the same window.

In some embodiments, a separation system may be included with device 700 so as to separate different phases of fluid, e.g., oil from water, so as to preferentially search for a species that is soluble in just one of the phases. Such a separation system is described above. The EPR/ionizing device 700 may be operated at the surface (e.g., at the wellhead) or miniaturized for in-well applications (permanent or temporary). Examples of device operation at the surface or for in-well application are described above. In some embodiments, the well may have multiple flow-control valves allowing different parts of the well to flow. In these and other embodiments, the feedback loop may run all the way down to those valves, e.g., to control different water entry points in an enhanced oil recovery (EOR) system.

In at least one embodiment, the feedback of the amount of diamagnetic species may be used in a flow-assurance workflow, e.g., to increase or decrease the amount of scale inhibitor being applied. The output of the system may be used as part of a feedback loop to manage scale deposition, for example, to alert an operator to a recommended change in volume or chemistry of inhibitor.

In some embodiments, a pulse-based EPR system or a continuous wave (CW) system may be used with device 700. Both techniques are well-established in the industry, and further detail may be found in U.S. Pat. Pub. No. 2018/0224414, which is herein incorporated by reference in its entirety. For example, and with reference to FIG. 1A, the resonator cavity 103 may be excited with continuous wave or pulsed excitation. In at least one embodiment, the EPR sensor is a sensor that operates at 1 GHz or higher. In some embodiments, the EPR sensor may operate at lower frequencies. For certain embodiments, the EPR sensor may operate in the range of 3-5 GHz.

U.S. patent application Ser. No. 15/875,823, issued as U.S. Pat. No. 10,564,308, which is herein incorporated by reference in its entirety, discloses performing multiple frequency and magnetic sweeps on the fluid to derive properties of the fluid such as its conductivity and permittivity, as well as determining chemical information such as the mass density of paramagnetic free radicals. All of those techniques are equally applicable in the case that the fluid has been subject to ionization. For example U.S. Pat. No. 10,564,308 discloses that the EPR spectrum may have a baseline offset that will need to be compensated. It is reasonable to anticipate that the EPR signature of the ionized fluid will also have a baseline offset, and the techniques disclosed in U.S. Pat. No. 10,564,308 may be applied.

In some embodiments, the RF field used to create the EPR spectrum may be created by a transmitter that is not in the flow of the fluid, and the RF field may impinge on the fluid through an electrical window 707 that is transparent to high-frequency electromagnetic fields as exemplified by FIG. 7B. Polyether ether ketone (PEEK) resonators may be used, for example, to contain the pressure, but allow magnetic and RF fields to penetrate. For the ionizing radiation that may be generated by hardware that is exposed to atmospheric temperature and pressure, the radiation passes through a window 706 that is transparent to the ionization, such as via a sapphire or diamond window. See e.g., U.S. Pat. No. 5,173,612 to Imai et al., entitled "X-ray Window and Method of Producing Same" and issued Dec. 22, 1992, which is herein incorporated by reference in its entirety. Pressure-containing windows transparent to gamma rays are commonly used in oilfield applications. For a non-limiting example, one is described in U.S. Pat. No. 4,661,700 to Holenka, entitled "Well Logging Sonde with Shielded Collimated Window" and issued Apr. 28, 1987, which is herein incorporated by reference in its entirety and may be utilized in embodiments of the present disclosure.

Figure 8:
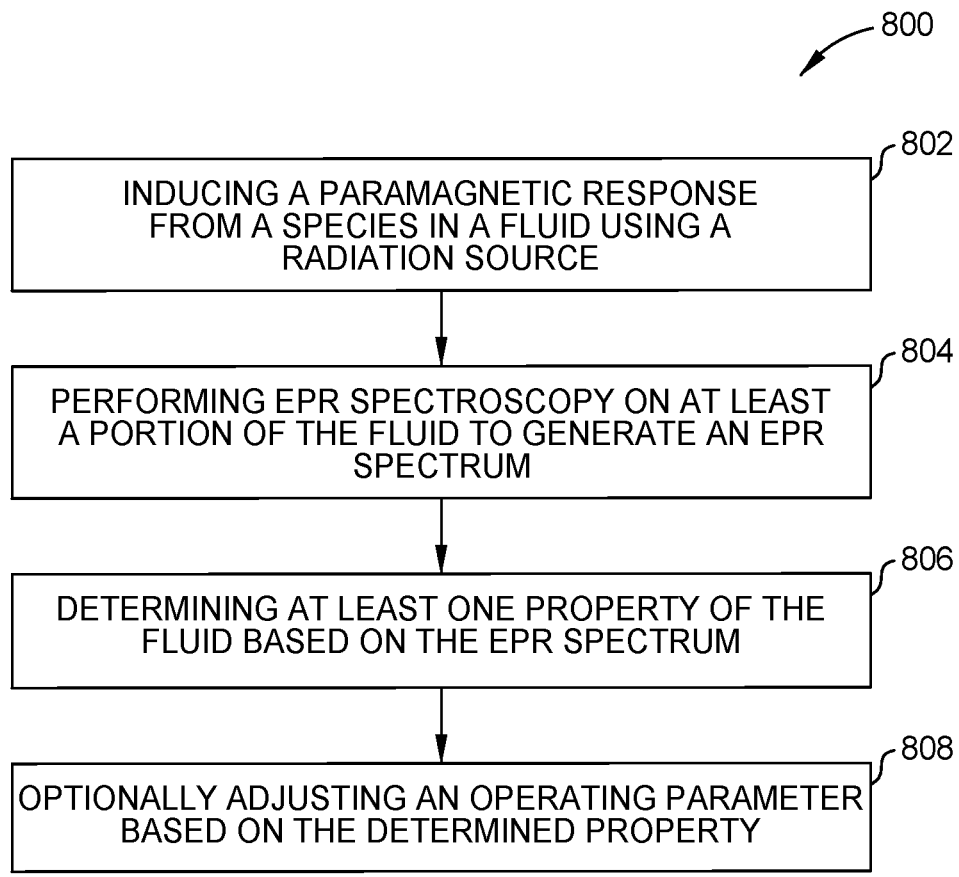
FIG. 8 is a flow diagram of an example method for determining a property of a fluid, in accordance with at least one embodiment of the present disclosure.

FIG. 8 is a flow diagram of an example method 800 for determining a property of a fluid, e.g., a wellbore fluid, in accordance with at least one embodiment of the present disclosure. The method 800 may include inducing (and/or causing) a paramagnetic response from a species in a fluid using a radiation source at operation 802. The radiation source may be a high-energy radiation source (e.g., gamma rays, neutrons, x-rays, THz radiation, ultra-violet radiation, plasma-beam, etc.). The method 800 may further include performing EPR spectroscopy (e.g., using an EPR spectrometer) on at least a portion of the fluid to generate an EPR spectrum at operation 804. The method 800 may further include determining at least one property of the fluid based on the EPR spectrum at operation 806. For some embodiments, the method 800 may optionally include adjusting an operating parameter (e.g., of a hydrocarbon recovery operation) based on the determined property at operation 628. Another optional operation that can be performed is introducing an inhibitor composition to the fluid. The inhibitor may be introduced at any point during the method 800.

In some embodiments, the methods described herein may include adjusting the microwave power, modulation amplitude, and/or sweep rate of the EPR spectrometer. Such adjustments may help in, e.g., minimizing (or avoiding) line-broadening artifacts.

With regard to specified characteristics of the EPR hardware in terms of signal strength, robustness to water conductivity, etc., methods of the present disclosure may include adjusting the EPR resonance. For example, 100 kHz magnetic field modulation may be used, which will create ~35 mG sidebands. If desired, shim coils may be used on the electromagnet to help ensure better magnet resolution. See U.S. Patent Publication No. 2018/0224414, and International Patent Publication No. 2018/148280, both of which are herein incorporated by reference in their entireties. Other modulation frequencies may also be used. For the microwave resonance frequency, X-band is commonly used, but lossy dielectric effects are reduced by dropping to a lower frequency such as in the range 1-5 GHz.

Embodiments of the present disclosure may also utilize data transmission to the Cloud, robust data interpretation, and/or standard data analysis techniques from artificial intelligence. Specifically, a range of produced water may be used in the laboratory to identify any effects of dissolved sodium chloride, and those may be used to train the algorithm. The lab data (and algorithm) may also be extended to common oilfield corrosion inhibitors, both anionic and cationic.

In some embodiments, a device may meter the reagent episodically over time (every month or so) and hence give a continuous update of inhibitor sufficiency without the need for personnel to visit the rig and take a sample. This device may be added to the systems, tools, and methods described herein. Thus, embodiments of the present disclosure can provide a unique platform to derive real-time EPR chemistry. The ability to, at least, dose real-time based on the methods, systems, and tools described herein provides significant advantages over conventional measurements and dosing.

In some embodiments, one or more operations of methods, systems, and tools described herein may be repeated to effect closed-loop control of the system using the EPR sensor. For example, a method may further include (1) repeating, after the adjusting, performing the EPR spectroscopy to generate an updated EPR spectrum; and (2) identifying a change in the updated EPR spectrum from a previously generated EPR spectrum.

In at least one embodiment, the methods, systems, and tools described herein may further involve determining at least one electromagnetic attribute of at least a portion of the fluid. In this case, the at least one electromagnetic attribute may include at least one of a conductivity, a dielectric property, a magnetic susceptibility, or a magnetic permeability, of the at least the portion of the fluid.

In at least one embodiment, operating parameters that may be adjusted during operation of the methods, systems, and tools described herein may include a rate or a volume of fluid injection into the flow system. Additionally or alternatively, the operating parameter may include a pressure, a type, or a concentration of an injected fluid (e.g., inhibitor, reagent, spin probe, etc.) introduced into the flow system.

In some embodiments, properties that can be determined by methods, systems, and tools described herein may include a concentration of inhibitor composition, a change in concentration of inhibitor composition over time, a volume percent of inhibitor composition, a concentration of micelles, a molar count of micelles, an estimation of aggregation number or a combination thereof.

In some embodiments, properties that can be determined by methods, systems, and tools described herein may include a concentration of a diamagnetic species, a change in concentration of a species over time, a volume percent of a species, a change in the physical representation of the species (e.g. dissolved or precipitated) or a combination thereof.

In some embodiments, the methods, systems, and tools described herein may include continuously monitoring the water sample using the EPR device and then once per period (e.g., per month) making an additional measurement by automatically adding a small (fixed quantity) of the reagent (e.g., a spin probe such as 5DSE) to the resonant cavity. The EPR may detect the change of signature in the spectrum from that of a reference spectrum and from that may make a measurement to derive the presence of micelles.

In some embodiments, the methods, systems, and tools described herein may include detection for and measurement of dissolved transition metals continuously and/or measurement of corrosion micelle information by adding reagents on an episodic basis.

In some embodiments, the methods, systems, and tools described herein may include one or more of operating a wellbore; adding an inhibitor, surfactant, and/or reagent to the fluid (e.g., a wellbore fluid); changing the rate of addition of the inhibitor, surfactant, and/or reagent to the fluid; and adding an inhibitor, surfactant, and/or reagent to the fluid in response to the EPR spectrum of the fluid.

Other operations that may be part of methods, systems, and tools described herein may include performing an intervention, scraping tubing walls, injecting inhibitor and allowing the inhibitor to soak, changing injection rates or injected chemicals (e.g., at the surface), changing wellhead pressure, changing injected enhanced oilfield recovery (EOR) fluid (e.g., in a nearby well), and the like.

At least one consideration for embodiments of the present disclosure may be the effect of water conductivity. In at least one embodiment, the methods, systems, and tools described herein may include performing a correction in micelle estimation due to salts (e.g., NaCl) in the water. Salts such as NaCl can change the size of micelles, which in turn, can affect the proportionality ratio on spin exchange frequency. Calibration by, e.g., an in-situ measurement of conductivity, can remove this effect. In some embodiments, the EPR device itself may perform a salt correction to the coupling constant calculation. That is, when an EPR signal is measured, a quality factor (Q) of the EPR resonator may also be measured. Changes in Q are directly mappable against changes in conductivity, so the EPR device can make the salt correction, if any, to the coupling constant calculation.

The micelle calculation can be made robust in the presence of "contaminating" features such as temperature and the effect of salts such as NaCl on micelle size through the use of laboratory calibration and/or machine learning. Similar techniques may provide data derivation that is immune from the presence of extra EPR signals from other metal ions dissolved in the water In some embodiments, the micelle calculation can be performed in the presence of "contaminating" features such as temperature or the effect of NaCl on micelle size, as well as the presence of other metal ions dissolved in water causing extra EPR signals. In some embodiments, the methods, systems, and tools described herein may include detection for and measurement of other contaminants. As described above, the EPR device is sensitive to some corrosion byproducts such as $Mn^{2+}$ and $Fe^{3+}$. In some embodiments, the methods, systems, and tools described herein may include detection for and measurement of dissolved transition metals. This detection and measurement may be done continuously. In some embodiments, corrosion micelle information may be measured by adding reagents on an episodic basis. In some embodiments, the EPR methods, systems, and tools may perform a combination of real-time measuring and detection of corrosion byproducts and corrosion micelle information may be measured by adding reagents.

According to at least one embodiment, one or more operations of the methods described above may be included as instructions in a computer-readable medium for execution by a control unit (e.g., controller module 306) or any other processing system. The computer-readable medium may include any suitable memory for storing instructions, such as read-only memory (ROM), random access memory (RAM), flash memory, an electrically erasable programmable ROM (EEPROM), a compact disc ROM (CD-ROM), a floppy disk, and the like.

EMBODIMENTS LISTING

The present disclosure provides, among others, the following embodiments, each of which may be considered as optionally including any alternate embodiments.

Clause 1. A method of determining at least one property of a fluid flowing through a system, comprising:
  inducing a paramagnetic response from at least one diamagnetic species flowing through the system, the fluid comprising the at least one diamagnetic species;

performing electron paramagnetic resonance (EPR) spectroscopy on at least a portion of the fluid to generate an EPR spectrum; and determining at least one property of the fluid based on the EPR spectrum.

Clause 2. The method of Clause 1, wherein inducing a paramagnetic response comprises exposing the at least the portion of the fluid to electromagnetic energy, the electromagnetic energy comprising gamma rays, neutrons, x-rays, THz radiation, ultra-violet radiation, a plasma beam, or a combination thereof.

Clause 3. The method of Clause 1 or Clause 2, wherein the diamagnetic species comprises an ion, an element, a hydrate, a wax, a paraffin, an inorganic precipitate, an organic precipitate, asphaltene, scale, or a combination thereof.

Clause 4. The method of any one of Clause 1-3, wherein:
the ion comprises $Ca^{2+}$, $Mg^{2+}$, $Ba^{2+}$, $Sr^{2+}$, $Na^+$, $K^+$, $CO_3^{2-}$, $SO_4^{2-}$, $Cl^-$, or a combination thereof; or
the element comprises calcium, magnesium, barium, strontium, sodium, potassium, carbon, sulfur, oxygen, chlorine, or a combination thereof.

Clause 5. The method of any one of Clause 1-4, wherein the at least one property comprises a concentration of the at least one diamagnetic species, a change in the concentration of the at least one diamagnetic species over time, a volume percent of the at least one diamagnetic species, or a combination thereof.

Clause 6. The method of any one of Clause 1-5, further comprising determining at least one electromagnetic attribute of the at least the portion of the fluid.

Clause 7. The method of Clause 6, wherein determining the at least one electromagnetic attribute is based on performing the EPR spectroscopy and wherein the at least one electromagnetic attribute comprises at least one of a conductivity, a dielectric property, a magnetic susceptibility, a magnetic permeability, or a combination thereof, of the at least the portion of the fluid.

Clause 8. The method of any one of Clause 1-7, wherein the fluid comprises a multiphase fluid.

Clause 9. The method of any one of Clause 1-8, further comprising adjusting an operating parameter associated with the system based on the determined property.

Clause 10. The method of any one of Clause 1-9, further comprising introducing an inhibitor composition to the fluid.

Clause 11. The method of any one of Clause 1-10, further comprising one or more of:
changing a rate of addition of an inhibitor composition, a surfactant, and/or a reagent to the fluid; or
adding an inhibitor composition, a surfactant, and/or a reagent to the fluid in response to the EPR spectrum of the fluid.

Clause 12. The method of any one of Clause 1-11, further comprising one or more of the following based on the determined property:
operating a wellbore;
performing an intervention;
scraping tubing walls;
changing wellhead pressure; or changing injected enhanced oilfield recovery (EOR) fluid.

Clause 13. A method of determining at least one property of a fluid flowing through a system, the fluid comprising at least one diamagnetic species, the method comprising:
inducing a paramagnetic response that is indicative of a property of the diamagnetic species;

performing electron paramagnetic resonance (EPR) spectroscopy on a portion of the fluid to generate an EPR spectrum from the paramagnetic response; and determining at least one property of the fluid based on an attribute of the EPR spectrum.

Clause 14. The method of Clause 13, wherein an attribute of the spectrum comprises a peak-to-peak distance, distance between peaks, the maximum EPR measurement recorded in that sample, or a combination thereof.

Clause 15. The method of Clause 13 or Clause 14, wherein inducing a paramagnetic response comprises exposing the at least the portion of the fluid to electromagnetic energy, the electromagnetic energy comprising gamma rays, neutrons, x-rays, ultra-violet radiation, THz radiation, a plasma beam, or a combination thereof.

Clause 16. The method of any one of Clause 13-15, wherein the diamagnetic species comprises an ion, an element, a hydrate, a wax, a paraffin, an inorganic precipitate, an organic precipitate, asphaltene, scale, or a combination thereof.

Clause 17. The method of Clause 16, wherein:
the ion comprises $Ca^{2+}$, $Mg^{2+}$, $Ba^{2+}$, $Sr^{2+}$, $Na^+$, $K^+$, $CO_3^{2+}$, $SO_4^{2+}$, $Cl^-$, or a combination thereof; or
the element comprises calcium, magnesium, barium, strontium, sodium, potassium, carbon, sulfur, oxygen, chlorine, or a combination thereof.

Clause 18. The method of any one of Clause 13-17, wherein the at least one property comprises a concentration of the at least one diamagnetic species, a change in the concentration of the at least one diamagnetic species over time, a volume percent of the at least one diamagnetic species, or a combination thereof.

Clause 19. The method of any one of Clause 13-18, further comprising determining at least one electromagnetic attribute of the at least the portion of the fluid.

Clause 20. The method of Clause 19, wherein the at least one electromagnetic attribute comprises a conductivity, a dielectric property, a magnetic susceptibility, a magnetic permeability, or a combination thereof, of the at least the portion of the fluid.

Clause 21. The method of any one of Clause 13-20, wherein the fluid comprises a multiphase fluid.

Clause 22. The method of any one of Clause 13-21, further comprising adjusting an operating parameter associated with the system based on the determined property.

Clause 23. The method of any one of Clause 13-22, further comprising introducing an inhibitor composition to the fluid.

Clause 24. The method of any one of Clause 13-23, further comprising one or more of:
changing a rate of addition of an inhibitor composition, a surfactant, and/or a reagent to the fluid; or
adding an inhibitor composition, a surfactant, and/or a reagent to the fluid in response to the EPR spectrum of the fluid.

Clause 25. The method of any one of Clause 13-24, further comprising one or more of the following based on the determined property:
operating a wellbore;
performing an intervention;
scraping tubing walls;
changing wellhead pressure; or changing injected enhanced oilfield recovery (EOR) fluid.

Clause 26. An apparatus for determining at least one property of a fluid flowing through a system, comprising:
at least one sensor, the sensor comprising a source of electromagnetic energy, the source of electromagnetic energy being configured to induce a paramagnetic response from at least one diamagnetic species in the fluid flowing through the system, the fluid comprising the at least one diamagnetic species;

an electron paramagnetic resonance (EPR) spectrometer, the EPR spectrometer being configured to perform EPR spectroscopy on at least a portion of the fluid to generate an EPR spectrum;

at least one processor coupled to the EPR spectrometer and the at least one sensor, the at least one processor being configured to determine at least one property of the fluid based on the EPR spectrum; and a conduit through which a fluid flows.

Clause 27. The apparatus of Clause 26, further comprising:

a pressurized housing through which a fluid can flow;
a radiation source;
an electron paramagnetic resonance (EPR) device having an RF transceiver;
a first window disposed on the pressurized housing that is transparent to electromagnetic energy;
a second window disposed on the pressurized housing that is electrically transparent to RF fields; and
a processor, configured to determine a property of the fluid.

Clause 28. The apparatus of Clause 26 or Clause 27, wherein the fluid comprises a species that is diamagnetic in the absence of radiation.

Clause 29. The apparatus of Clause 28, wherein the species that is diamagnetic in the absence of radiation comprises an ion, an element, a hydrate, a wax, a paraffin, an inorganic precipitate, an organic precipitate, asphaltene, scale, or a combination thereof.

Clause 30. The apparatus of any one of Clauses 26-29, wherein the property is a concentration of a diamagnetic species, a change in concentration of a diamagnetic species over time, a volume percent of a diamagnetic species or a combination thereof.

Clause 31. A non-transitory computer-readable medium storing instructions that, when executed on a processor, perform operations for detecting a property of a fluid flowing through a system, the operations comprising:

inducing a paramagnetic response from at least one diamagnetic species flowing through the system, the fluid comprising the at least one diamagnetic species;

performing electron paramagnetic resonance (EPR) spectroscopy on at least a portion of the fluid to generate an EPR spectrum; and determining at least one property of the fluid based on the EPR spectrum.

Clause 32. The non-transitory computer-readable medium of Clause 31, wherein inducing a paramagnetic response comprises exposing at least a portion of the fluid to electromagnetic energy, the electromagnetic energy comprising gamma rays, neutrons, x-rays, THz radiation, ultra-violet radiation, a plasma beam, or a combination thereof.

Clause 33. The non-transitory computer-readable medium of Clause 31 or Clause 32, wherein the diamagnetic species comprises an ion, an element, a hydrate, a wax, a paraffin, an inorganic precipitate, an organic precipitate, asphaltene, scale, or a combination thereof.

Clause 34. The non-transitory computer-readable medium of Clause 33, wherein:

the ion comprises $Ca^{2+}$, $Mg^{2+}$, $Ba^{2+}$, $Sr^{2+}$, $Na^+$, $K^+$, $C_3^{2-}$, $SO_4^{2-}$, $Cl^-$, or a combination thereof; or the element comprises calcium, magnesium, barium, strontium, sodium, potassium, carbon, sulfur, oxygen, chlorine, or a combination thereof.

Clause 35. The non-transitory computer-readable medium of any one of Clauses 31-34, wherein the at least one property is a concentration of the at least one diamagnetic species, a change in concentration of the at least one diamagnetic species over time, a volume percent of the at least one diamagnetic species, or a combination thereof.

Clause 36. The non-transitory computer-readable medium of any one of Clauses 31-35, further comprising determining at least one electromagnetic attribute of at least a portion of the fluid.

Clause 37. The non-transitory computer-readable medium of Clause 36, wherein the at least one electromagnetic attribute comprises a conductivity, a dielectric permittivity, a magnetic susceptibility, a magnetic permeability, or a combination thereof, of the at least a portion of the fluid.

Clause 38. The non-transitory computer-readable medium of any one of Clauses 31-37, wherein the fluid comprises a multiphase fluid.

Clause 39. The non-transitory computer-readable medium of any one of Clauses 31-38, further comprising adjusting an operating parameter associated with the system based on the determined property.

Clause 40. The non-transitory computer-readable medium of any one of Clauses 31-39, further comprising introducing an inhibitor composition to the fluid.

Clause 41. The non-transitory computer-readable medium of any one of Clauses 31-40, further comprising one or more of:

changing a rate of addition of an inhibitor composition, a surfactant, and/or a reagent to the fluid; or adding an inhibitor composition, a surfactant, and/or a reagent to the fluid in response to the EPR spectrum of the fluid.

Clause 42. The non-transitory computer-readable medium of any one of Clauses 31-41, further comprising one or more of the following based on the determined property:

operating a wellbore;
performing an intervention;
scraping tubing walls;
changing wellhead pressure; or changing injected enhanced oilfield recovery (EOR) fluid.

Clause 43. A method of determining at least one property of a first fluid flowing through a system, comprising:

introducing an inhibitor composition to the first fluid flowing through the system to form a second fluid;

performing electron paramagnetic resonance (EPR) spectroscopy on at least a portion of the second fluid to generate an EPR spectrum; and determining at least one property of the second fluid based on the EPR spectrum.

Clause 44. The method of Clause 43, further comprising adding a spin probe to the second fluid after introducing the inhibitor composition to the first fluid.

Clause 45. The method of Clause 43 or Clause 44, wherein the spin probe is a nitroxide spin probe.

Clause 46. The method of any one of Clauses 43-45, wherein the inhibitor composition is diamagnetic.

Clause 47. The method of any one of Clauses 43-46, further comprising adjusting an operating parameter associated with the system based on the determined property.

Clause 48. The method of any one of Clauses 43-4, further comprising determining at least one electromagnetic attribute of at least a portion of the second fluid.

Clause 49. The method of Clause 48, wherein the at least one electromagnetic attribute comprises a conductivity, a dielectric permittivity, a magnetic susceptibility, a magnetic permeability, or a combination thereof, of the at least a portion of the second fluid.

Clause 50. The method of any one of Clauses 43-49, wherein the at least one property comprises a concentration of the inhibitor composition, a change in the concentration of the inhibitor composition over time, a volume percent of the inhibitor composition, a concentration of micelles, a molar count of micelles, or a combination thereof.

Clause 51. The method of any one of Clauses 43-50, wherein the first fluid is a wellbore fluid.

Clause 52. The method of any one of Clauses 43-51, wherein the inhibitor composition comprises a surfactant, the surfactant being anionic, cationic, zwitterionic, non-ionic, or a combination thereof.

Clause 53. The method of any one of Clauses 43-52, further comprising one or more of:
changing a rate of addition of the inhibitor composition, a spin probe, or a combination thereof to the first fluid and/or second fluid; or
adding the inhibitor composition, a spin probe, or a combination thereof to the second fluid in response to the EPR spectrum of the second fluid.

Clause 54. The method of any one of Clauses 43-53, further comprising one or more of the following based on the determined property:
operating a wellbore;
performing an intervention;
scraping tubing walls;
changing wellhead pressure; or
changing injected enhanced oilfield recovery (EOR) fluid.

Clause 55. A non-transitory computer-readable medium storing instructions that, when executed on a processor, perform operations for detecting a property of a first fluid flowing through a system, the operations comprising:
introducing an inhibitor composition to the first fluid flowing through the system to form a second fluid;
performing electron paramagnetic resonance (EPR) spectroscopy on at least a portion of the second fluid to generate an EPR spectrum; and
determining at least one property of the second fluid based on the EPR spectrum.

Clause 56. The non-transitory computer-readable medium of Clause 55, further comprising adding a spin probe to the second fluid after introducing the inhibitor composition to the first fluid.

Clause 57. The non-transitory computer-readable medium of Clause 56, wherein the spin probe is a nitroxide spin probe.

Clause 58. The non-transitory computer-readable medium of any one of Clauses 55-57, wherein the inhibitor composition is diamagnetic.

Clause 59. The non-transitory computer-readable medium of any one of Clauses 55-58, further comprising adjusting an operating parameter associated with the system based on the determined property.

Clause 60. The non-transitory computer-readable medium of any one of Clauses 55-59, further comprising determining at least one electromagnetic attribute of at least a portion of the second fluid.

Clause 61. The non-transitory computer-readable medium of Clause 60, wherein the at least one electromagnetic attribute comprises a conductivity, a dielectric permittivity, a magnetic susceptibility, a magnetic permeability, or a combination thereof, of the at least a portion of the second fluid.

Clause 62. The non-transitory computer-readable medium of any one of Clauses 55-61, wherein the at least one property comprises a concentration of the inhibitor composition, a change in the concentration of the inhibitor composition over time, a volume percent of the inhibitor composition, a concentration of micelles, a molar count of micelles, or a combination thereof.

Clause 63. The non-transitory computer-readable medium of any one of Clauses 55-62, wherein the first fluid is a wellbore fluid.

Clause 64. The non-transitory computer-readable medium of any one of Clauses 55-63, wherein the inhibitor composition comprises a surfactant, the surfactant being anionic, cationic, zwitterionic, non-ionic, or a combination thereof.

Clause 65. The non-transitory computer-readable medium of any one of Clauses 55-64, further comprising one or more of:
changing a rate of addition of the inhibitor composition, a spin probe, or a combination thereof to the first fluid and/or second fluid; or
adding the inhibitor composition, a spin probe, or a combination thereof to the second fluid in response to the EPR spectrum of the second fluid.

Clause 66. The non-transitory computer-readable medium of any one of Clauses 55-65, further comprising one or more of the following based on the determined property:
operating a wellbore;
performing an intervention;
scraping tubing walls;
changing wellhead pressure; or
changing injected enhanced oilfield recovery (EOR) fluid.

All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

LITERATURE

1. Jones, L W, Corrosion and Water Technology for Petroleum Producers, Tulsa Oklahoma, USA, OGCI 1988.
2. Tuttle, T N, "Corrosion in Oil and Gas Production", Journal of Petroleum Technology 39, 1987, pp. 756-762.
3. Broudel, D., et al, "Corrosion in the Oil Industry", SLB Oilfield Review, April 1994.
4. "Pipeline Leaks and Breaks," Minerals Management Service, U.S. Department of Interior, Metairie, La., 1990.
5. Andersen, T., and Misund, A., "Pipeline Reliability: An Investigation of Pipeline Failure Characteristics and Analysis of Pipeline Failure Rates for Submarine and Cross-Country Pipelines," Journal of Petroleum Technology, April 1983.
6. Starting, J., "A Survey of Pipelines in the North Sea: Incidents During Installation, Testing and Operation," Offshore Technology Conference, Paper No. 4069, 1981.
7. Kulbrandstad, O., Lovell, J., Godoy M. "Real-time Asphaltene Measurements Improve Flow Assurance Workflows and Reduce Costs", Tekna Norway, 2018.
8. Abdallah, D., et al, "Asphaltene Studies in On-shore Abu Dhabi Fields, Part IV: Development of a Surface Sensor", SPE-191676 presented at SPE ATCE Dallas, 2018.
9. Rankin, S. et al "Technology Update: Improving Corrosion Management by Using a Micelle Detection Technology,", SPE-0318-0020, Journal Petroleum Technology, March 2018.
10. McCarty, P. and Aieta, E., "Chemical Indicators and Surrogate Parameters in Water Treatment", Journal American Water Works Association, Vol 76, No 10, October 1984, pp. 98-106.
11. U.S. Patent Pub. No. 2016/0223478.
12. U.S. Pat. No. 9,689,954.
13. Kulbrandstad, O. et al, "Online Monitoring of Production Process Using Electron Paramagnetic Resonance (EPR)," PCT/US2018/017224.
14. Weil, J. A. Weil and Bolton, J. R., Electron Paramagnetic Resonance: Elementary Theory and Practical Applications, John Wiley & Sons, 2007.
15. Gilbert et al., Electron Paramagnetic Resonance, Volume 20, The Royal Society of Chemistry, Cambridge UK 2007.
16. A. Schweiger and G. Jeschke, Principles of Pulse Electron Paramagnetic Resonance, Oxford University Press, 2001.
17. Eaton, G. R., Eaton, S. S., Barr, D. P. and Weber, R. T., Quantitative EPR, Springer Vienna, 2010.
18. Lovell, J., and Chew, W., "Effect of tool eccentricity on some electrical well-logging tools," IEEE Transactions on Geoscience and Remote Sensing, 1990.
19. Lovell, J. and Habashy, T. "An induction gradiometer for conductivity contrast detection: Theoretical considerations," Radio Science, 1990.
20. Palmer J, et al, "Optimization of Magnetic Field Sweep and Field Modulation Amplitude for Continuous-Wave EPR Oximetry," Journal of Magnetic Resonance. 2011 April; 209(2): 337-340.
21. Bales, B. L. "A Definition of the Degree of Ionization of a Micelle Based on Its Aggregation Number", *J. Phys. Chem. B* 2001, 105, 6798-6804.
22. Jolicoeur, C., Friedman H. L., "ESR line shapes and kinetic behavior of nitroxide spin probes in micellar solutions," J. Solution Chem 1978, 7, 813.
23. Molin, Y. N., Salikhov K. M., Zamaraev, K. I., Spin exchange principles and applications in Chemistry and Biology; Springer-Verlag:New York, 1980; Vol. 8.
24. Windle, J. J., Hyperfine coupling constants for nitroxide spin probes in water and carbon tetracholoride, J. Magnetic Resonance, Vol 45, Issue 3, 1981, pp. 432-439.
25. Bordignon, E., EPR Spectroscopy of Nitroxide Spin Probes, doi.org/10.1002/9780470034590.emrstm1513 eMagRes, 2017, pp. 235-254.
26. Griffith, O. H. and Waggoner, A. S., Nitroxide Free Radicals: Spin Labels for Probing Biomolecular Structure Acc. Chem. Res., 1969, 2 (1), pp 17-24.
27. Salager, J-L, Surfactants Types and Uses, FIRP Booklet #E300-A, 2002.
28. Lin-Guang Q., An-Jian X. and Yu-Hua S., Appl Surf Sci., 246 (2005) 1.
29. Driver, R. and Meakins, R. J., Br. Corr. J, 12 (1977) 46.
30. Hosseini, M., Mertens, S. F. L., and Arhadi, M. R., Corr. Sci., 45(2003) 1473.
31. Mu, G. N., Zhao, T. P., Liu M. and Gu T., Corrosion, 52 (1996) 853.
32. Elachouri, M., Hajji, M. S., Salem, M., Kertit, S., Aride, J., Coudert R. and Essassi, E. Corrosion, 52 (1996) 103.
33. M. M. Osman and M. N. Shalaby, Anti-Corr. Meth. Mat., 44 (1997) 318.
34. V. S. Sastri, Corrosion Inhibitors: Principles and Applications, John Wiley & Sons Ltd., New York (1998).
35. F. Bentiss, M. Traisnel and M. Lagrenee, J Appl Electrochem., 31 (2001) 41.
36. N. Hajjaji, I. Rico, A. Srhiri, A. Lattes, M. Soufiaoui and A. B. Bachir, Corrosion, 49 (1993) 326.
37. K. A. Zacchariasse, N. V. Phuc, B. Kozankiewicz, J. Phys. Chem, 85 (1981) 2676.
38. Malik, M. A., Hashim, M. A., Nabi, F., Al-Thabaiti, S. A., Khan, Z. Anticorrosion ability of surfactants: a review, Int J. Electrochem. Sci, 6, 2011, pp 1927-1948.
39. U.S. Patent Application Pub. No. 2018/0224414.
40. P. Rostron "Critical Review of Pipeline Scale Measurement Technologies", MOJ Mining and Metallurgy, 2018 1(1).
41. M. A. H. Rushdi, A. A. Abdel-Fattah and Y. S. Soliman, "Physico-chemical studies for strontium sulfate radiation dosimeter", Journal of Radiation Research and Applied Sciences, Volume 8, Issue 2, April 2015, Pages 221-225.
42. Gelardi F., Agnello S., "Gamma rays Induced Conversion of Native Defects in Natural Silica", in: Pacchioni G., Skuja L., Griscom D. L. (eds) Defects in $SiO_2$ and Related Dielectrics: Science and Technology. NATO Science Series (Series II: Mathematical and Physical Chemistry), vol 2. Springer, Dordrecht, 2000.
43. U.S. Pat. No. 5,804,820.
44. U.S. patent application Ser. No. 15/875,823, "ELECTRON PARAMAGNETIC RESONANCE (EPR) TECHNIQUES AND APPARATUS FOR PERFORMING EPR SPECTROSCOPY ON A FLOWING FLUID."
45. U.S. Pat. No. 5,173,612.
46. U.S. Pat. No. 4,661,700.
47. https://www.corrosionpedia.com/dictionary/tags/type-of-corrosion
48. "Corrosion Problems during Oil and Gas Production and its Mitigation," *International Journal of Industrial Chemistry,* 2013, 4:35, by Lekan Toafeek Popoola, Alhaji Shehu Grema, Ganiyu Kayode Latinwo, Babagana Gutti, and Adebore Saheed Balogun.
49. "Identifying Key Performance Indicators for Corrosion in Oilfield Water Handling Systems," paper #4348, Corrosion 2014 Conference, San Antonio, TX, by Olagoke Olabisi, Amer Jarragh, Yousef Khuraibut, and Ashok Mathew
50. SPE 155107 "Micelle Detection for Optimizing Corrosion Inhibitor Dose on an Offshore Platform," presented by Cameron Mackenzie and Emma Perfect at the SPE International Conference & Workshop on Oilfield Corrosion, Aberdeen, 2012.
51. Handbook of Surfaces and Interfaces of Materials" edited by Hari Singh Nalwa, Elsevier, Oct. 26, 2001, Technology & Engineering, page 76.
52. U.S. Patent App. Pub. No. 2016/0238531.
53. U.S. Pat. No. 9,359,677.
54. U.S. Pat. No. 9,341,571.

55. U.S. Pat. Pub. No. 2016/0223478 by Aydin Babakhani and Xuebei Yang,
56. WO 2016/187300A1.
57. "Electron Paramagnetic Resonance (EPR) Techniques and Apparatus for Performing EPR Spectroscopy on a Flowing Fluid," by Manuel Godoy, Aydin Babakhani, Omar Kulbrandstad, and John Lovell, Appl. Ser. No. 15/875,823, filed Jan. 19, 2018.
58. U.S. Patent App. Pub. No. 2018/0120390
59. V. Jovancicevic, S. Ramachandran, P. Prince, "Inhibition of Carbon Dioxide Corrosion of Mild Steel by Imidazolines and Their Precursors", CORROSION, 1999; 55(5): 449-455, https://doi.org/10.5006/1.3284006
60. Wigg, H. and Fletcher, M. 1995. Establishing the True Cost of Downhole Scale Control. Paper presented at the 1995 International Conference on Oilfield Scaling, Aberdeen, 20-21 November.
61. U.S. Pat. No. 9,926,485, "Nanoparticle carrier platform and methods for controlled release of subterranean well treatment additives."
62. U.S. Pat. No. 3,993,131, "Tracing flow of petroleum in underground reservoirs."
63. US 2019/0277729, "Methods and systems for sampling and/or analyzing fluid, such as production fluid from an oil and gas well."

What is claimed is:

1. A method of determining a physical representation of a species in a fluid flowing through a system, the method comprising:
   exposing the fluid to radiation to induce at least one paramagnetic response from at least one diamagnetic species present in the fluid flowing through the system;
   performing electron paramagnetic resonance (EPR) spectroscopy on the at least one paramagnetic response to generate an EPR spectrum; and
   determining the physical representation of the species in the fluid based on the EPR spectrum.

2. The method of claim 1, wherein the physical representation of the species in the fluid comprises the species being dissolved in the fluid, the species being a precipitate, a size of the species, or a combination thereof.

3. The method of claim 1, wherein the species is a metal salt, a metal ion, or a combination thereof.

4. The method of claim 1, wherein:
   the EPR spectroscopy is performed using an EPR spectrometer; and
   the method further comprises adjusting a microwave power of the EPR spectrometer, a modulation amplitude of the EPR spectrometer, a sweep rate of the EPR spectrometer, or a combination thereof.

5. The method of claim 1, further comprising adjusting an operating parameter associated with the system based on the determined physical representation of the species.

6. The method of claim 5, further comprising introducing an inhibitor to the fluid.

7. The method of claim 6, wherein the operating parameter comprises a rate of the inhibitor introduced to the fluid, a volume of the inhibitor introduced to the fluid, a concentration of the inhibitor introduced to the fluid, a type of the inhibitor introduced to the fluid, a pressure of the inhibitor introduced to the fluid, a temperature of the inhibitor introduced to the fluid, or a combination thereof.

8. The method of claim 1, further comprising:
   determining at least one electromagnetic attribute of the fluid;
   determining at least one property of the fluid; or
   a combination thereof.

9. The method of claim 8, wherein the at least one electromagnetic attribute comprises a conductivity, a complex dielectric value, a Q-factor, a magnetic susceptibility, a magnetic permeability, or a combination thereof.

10. The method of claim 8, wherein the at least one property comprises a concentration of the at least one diamagnetic species, a change in the concentration of the at least one diamagnetic species over time, a volume percent of the at least one diamagnetic species, or a combination thereof.

11. The method of claim 1, wherein the diamagnetic species comprises an ion, a chemical element, a hydrate, a wax, a paraffin, an inorganic precipitate, an organic precipitate, asphaltene, scale, or a combination thereof.

12. The method of claim 1, wherein the fluid is a wellbore fluid.

13. The method of claim 1, further comprising, based on the determined physical representation of the species, one or more of:
   operating a wellbore;
   performing an intervention;
   scraping tubing walls;
   changing wellhead pressure; or
   changing injected enhanced oilfield recovery (EOR) fluid.

14. A non-transitory computer-readable medium storing instructions that, when executed by a processor, performs operations for determining a physical representation of a species in a fluid flowing through a system, the operations comprising:
   exposing the fluid to radiation to induce at least one paramagnetic response from at least one diamagnetic species present in the fluid flowing through the system;
   performing electron paramagnetic resonance (EPR) spectroscopy on the at least one paramagnetic response to generate an EPR spectrum; and
   determining the physical representation of the species in the fluid based on the EPR spectrum.

15. The non-transitory computer-readable medium of claim 14, wherein the physical representation of the species in the fluid comprises a dissolved species, a precipitated species, a size of the species, or a combination thereof.

16. The non-transitory computer-readable medium of claim 14, wherein the species is a metal salt, a metal ion, or a combination thereof.

17. An apparatus for determining a physical representation of a species in a fluid configured to flow through a system, the apparatus comprising:
   a radiation source configured to induce at least one paramagnetic response from at least one diamagnetic species present in the fluid;
   an electron paramagnetic resonance (EPR) spectrometer configured to perform EPR spectroscopy on the at least one paramagnetic response to generate an EPR spectrum; and
   at least one processor coupled to the EPR spectrometer and the radiation source, the at least one processor being configured to determine the physical representation of the species in the fluid based on the EPR spectrum.

18. The apparatus of claim 17, further comprising a control output from a controller module, the control output configured to output a control signal to control injection of an inhibitor, via an injection line, into the fluid configured to flow through the system.

19. The apparatus of claim 17, wherein the EPR spectrometer comprises a radio frequency (RF) transceiver, the apparatus further comprising:

a pressurized housing through which the fluid is configured to flow;
a first window disposed on the pressurized housing that is transparent to electromagnetic energy; and
a second window disposed on the pressurized housing that is electrically transparent to RF fields.

20. The apparatus of claim 17, wherein the species is diamagnetic in an absence of electromagnetic energy.

* * * * *